(12) United States Patent
Ho et al.

(10) Patent No.: US 12,557,423 B2
(45) Date of Patent: Feb. 17, 2026

(54) IMAGE-SENSOR STRUCTURE AND METHOD OF MAKING THEREOF

(71) Applicant: Taiwan Semiconductor Manufacturing Company, Ltd., Hsinchu (TW)

(72) Inventors: Cheng Ying Ho, Minxiong Township (TW); Kai-Chun Hsu, Yonghe (TW); Wen-De Wang, Minsyong Township (TW); Wen-I Hsu, Tainan (TW); Cheng-Yu Hsieh, Tainan (TW); Hung Yu Wang, Keelung (TW); Yuh Ruey Huang, Hsinchu County (TW); Jen-Cheng Liu, Hsin-Chu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 39 days.

(21) Appl. No.: 18/776,326

(22) Filed: Jul. 18, 2024

(65) Prior Publication Data
US 2026/0026126 A1    Jan. 22, 2026

(51) Int. Cl.
*H10F 39/00* (2025.01)
*H10F 39/12* (2025.01)

(52) U.S. Cl.
CPC ......... *H10F 39/811* (2025.01); *H10F 39/199* (2025.01); *H10F 39/802* (2025.01); *H10F 39/8053* (2025.01); *H10F 39/8063* (2025.01); *H10F 39/807* (2025.01); *H10F 39/813* (2025.01)

(58) Field of Classification Search
CPC .... H10F 39/811; H10F 39/807; H10F 39/199; H10F 39/8063; H10F 39/8053; H10F 39/802; H10F 39/813
USPC ......................................................... 348/294
See application file for complete search history.

(56) References Cited

U.S. PATENT DOCUMENTS

| 10,629,644 | B1 * | 4/2020 | Chung | H04N 25/626 |
| 11,665,452 | B2 * | 5/2023 | Baek | H04N 25/778 |
| | | | | 257/306 |
| 11,735,624 | B2 * | 8/2023 | Kalnitsky | H01L 23/5223 |
| | | | | 257/534 |

(Continued)

FOREIGN PATENT DOCUMENTS

| TW | I822229 B | 11/2023 |
| TW | I846869 B | 7/2024 |

*Primary Examiner* — Pritham D Prabhakher
(74) *Attorney, Agent, or Firm* — Eschweiler & Potashnik, LLC

(57) ABSTRACT

Some embodiments relate to an integrated circuit (IC) image sensor having an array of pixel elements. Each pixel element of the array includes a semiconductor substrate having a first surface and an opposite second surface, a photodetector disposed within the substrate, and a portion of an interconnect structure disposed over the first surface of the semiconductor substrate. The interconnect structure includes conductive interconnects embedded in dielectric layers. The portion of the interconnect structure includes a photodetector gate electrode over the photodetector, and a capacitor. The pixel element has a footprint over the first surface. The capacitor has a footprint over the first surface. The footprint of the capacitor covers more than half of the footprint of the pixel element, which provides increased protection to the photodetector during manufacturing.

20 Claims, 17 Drawing Sheets

(56) References Cited

U.S. PATENT DOCUMENTS

| | | |
|---|---|---|
| 2011/0156197 A1 | 6/2011 | Tivarus et al. |
| 2014/0061636 A1* | 3/2014 | Miyake .................. H10D 86/60 |
| | | 257/43 |
| 2014/0206133 A1* | 7/2014 | Koezuka ............ H10D 30/6755 |
| | | 438/99 |
| 2020/0105816 A1 | 4/2020 | Chung et al. |
| 2020/0389608 A1 | 12/2020 | Baek et al. |
| 2022/0232180 A1* | 7/2022 | Mun .................... H04N 25/778 |
| 2024/0047485 A1 | 2/2024 | Chang et al. |
| 2024/0302543 A1* | 9/2024 | Zhang .................. H10F 39/811 |
| 2025/0133856 A1* | 4/2025 | Hong .................... H10F 39/809 |
| 2025/0221073 A1* | 7/2025 | Korobov ............. H10F 39/8063 |

* cited by examiner

301

1700

1800

IMAGE-SENSOR STRUCTURE AND METHOD OF MAKING THEREOF

BACKGROUND

Many electronic devices, such as, for example, cameras, mobile telephones, laptops, and computers, include integrated-circuit (IC) image sensors. Image sensors may use arrays of pixel elements to convert incident light into electric signals that are then used to generate corresponding digital images. The IC image sensors may be manufactured using, for example, complementary metal-oxide-semiconductor (CMOS) technology, generating CMOS image sensors (CIS).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
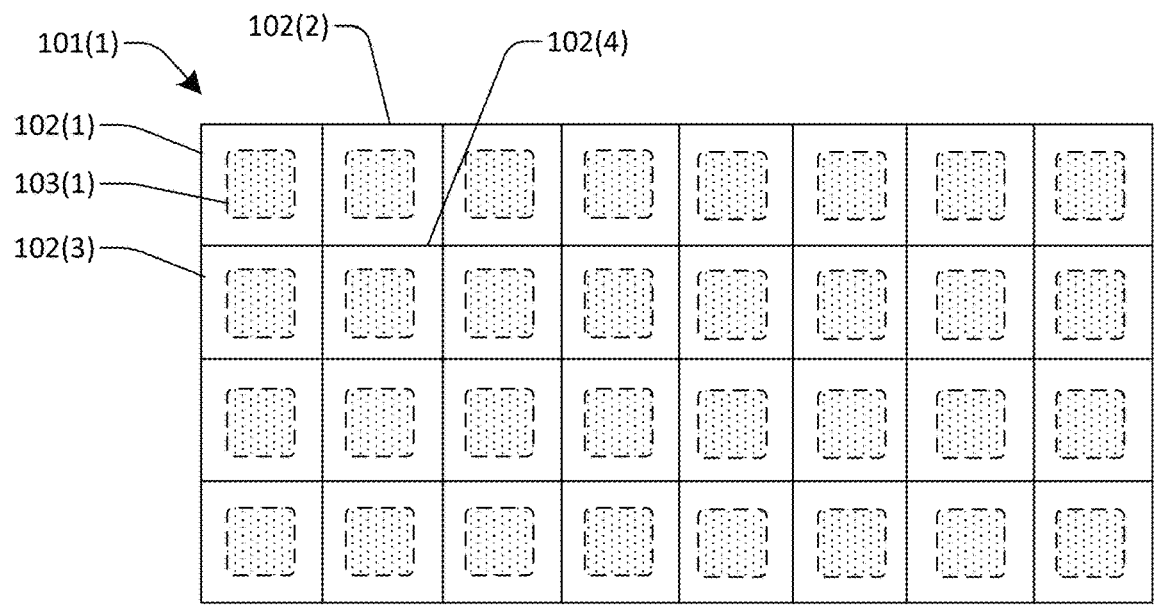
FIG. 1 illustrates a simplified top view of an example array of pixel elements in accordance with some embodiments of the disclosure.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "under," "lower," "above," "over," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees, 180 degrees, or at other orientations) and the spatially relative descriptors used herein may likewise be interpreted accordingly.

Moreover, "first", "second", "third", etc. may be used herein for ease of description to distinguish between different elements of a figure or a series of figures. "first", "second", "third", etc. are not intended to be descriptive of the corresponding element, but rather are merely generic identifiers. For example, "a first dielectric layer" described in connection with a first figure may not necessarily correspond to a "first dielectric layer" described in connection with some embodiments, but rather may correspond to a "second dielectric layer" in other embodiments.

CMOS image sensors comprise arrays of pixel elements. Many CMOS image sensors operate using backside illumination and may accordingly be referred to as backlit image sensors. This is enabled by forming the photodetectors, corresponding devices (such as, for example, transistors and capacitors), corresponding conductive interconnects, and corresponding dielectric layers of the pixel elements on a front side of a semiconductor substrate. The back side of the substrate may then be thinned down to a thickness that allows light photons to penetrate the back side of the substrate to reach the photodetectors relatively easily. Color filters and optical elements for enhancing the optical properties of the image sensors, through which the pixel elements of the image sensors receive light, are formed on the thinned back side. This allows designing and forming the frontside layers of active devices, passive devices, and conductive interconnects without the restrictions that frontside-illuminated image sensors would require in order to allow sufficient light to reach the photodetector elements. It should be noted that, as used herein, the term light refers to electromagnetic radiation generally having a wavelength within or near the visible light spectrum, including, but not limited to, infrared and ultraviolet light.

A pixel element of a CMOS image sensor typically includes a charge-collecting capacitor for collecting charges generated by a corresponding photodetector from the absorption of received photons. The charge-collecting capacitor may be formed as two parallel metallic plates separated by a dielectric layer. In order to reduce material costs and to allow for the placement of other circuit components, the area taken up by the charge-collecting capacitor is conventionally less than half of the area of the corresponding image sensor and often less than one third. In some image sensors, a set of two pixel elements may share a common charge-collecting capacitor, in which case the area of the capacitors may be less than one fourth of the area of the corresponding pixel elements. It should be noted that, unless otherwise indicated, as used herein, the term "area" in reference to an IC element refers to the area of the footprint of the IC element, where the footprint is the orthographic projection of the IC element on the corresponding surface of the substrate.

One or more of the capacitor components may be formed using high-energy processing acts such as, for example, dry etching using plasma. The high-energy plasma particles (e.g., ions) may cause some damage to structures in the substrate, such as the photodetector, which may result in a degradation of the performance of the photodetector element of the image sensor. This damage might not be detectable by reverse engineering (e.g., decapsulating, grinding, and imaging) an impacted image sensor using available inspection methods. However, the damage may be inferred from measurably degraded performance of the photodetector. This degradation might be particularly noticeable in an image sensor used for high dynamic range (HDR) image-sensing applications, where impacted pixel elements might be more likely to suffer from dark currents or white pixels.

As metallic plates help to provide protection from plasma damage during etching, enlarging the area of the charge-collecting capacitors to mostly or entirely cover the photodetectors would mostly or wholly avoid the above-described performance degradation from plasma damage.

In some embodiments of the present disclosure, an integrated circuit (IC) image sensor has an array of pixel elements. Each pixel element of the array includes a semiconductor substrate having a first surface and an opposite second surface, a photodetector disposed within the substrate, and an interconnect structure over the first surface of the semiconductor substrate. The interconnect structure includes conductive interconnects embedded in dielectric layers, a photodetector gate electrode for the photodetector, and a charge-collecting capacitor. The pixel element and capacitor have respective footprints, where the footprint of the capacitor covers more than half of the footprint of the pixel element, which provides increased protection to the photodetector during the fabrication of the IC image sensor. Specifically, this relative size of the charge-collecting capacitor provides measurable protection to the image sensor's photodetector against plasma damage during dry etching processes, thereby enhancing the operational performance of the resultant IC image sensor.

FIG. 1 illustrates a simplified top view of an example array 100 of pixel elements 102 in accordance with some embodiments of the disclosure. The array 100 may be a sub-array of a larger array of pixel elements 102. For example, the array 100, which includes 32 pixel elements 102 may be part of a larger array of millions of pixel elements 102. The array 100 is organized as a set of foursomes 101 corresponding to two-by-two arrays of pixel elements 102. For example, foursome 101(1) comprises pixel elements 102(1), 102(2), 102(3), and 102(4). Each pixel element 102 includes a photodetector 103 such as photodetector 103(1) of pixel element 102(1). For clarity and simplicity, only the elements of foursome 101(1) are labeled in the figure; the other foursomes 101 are substantially identical.

Figure 2:
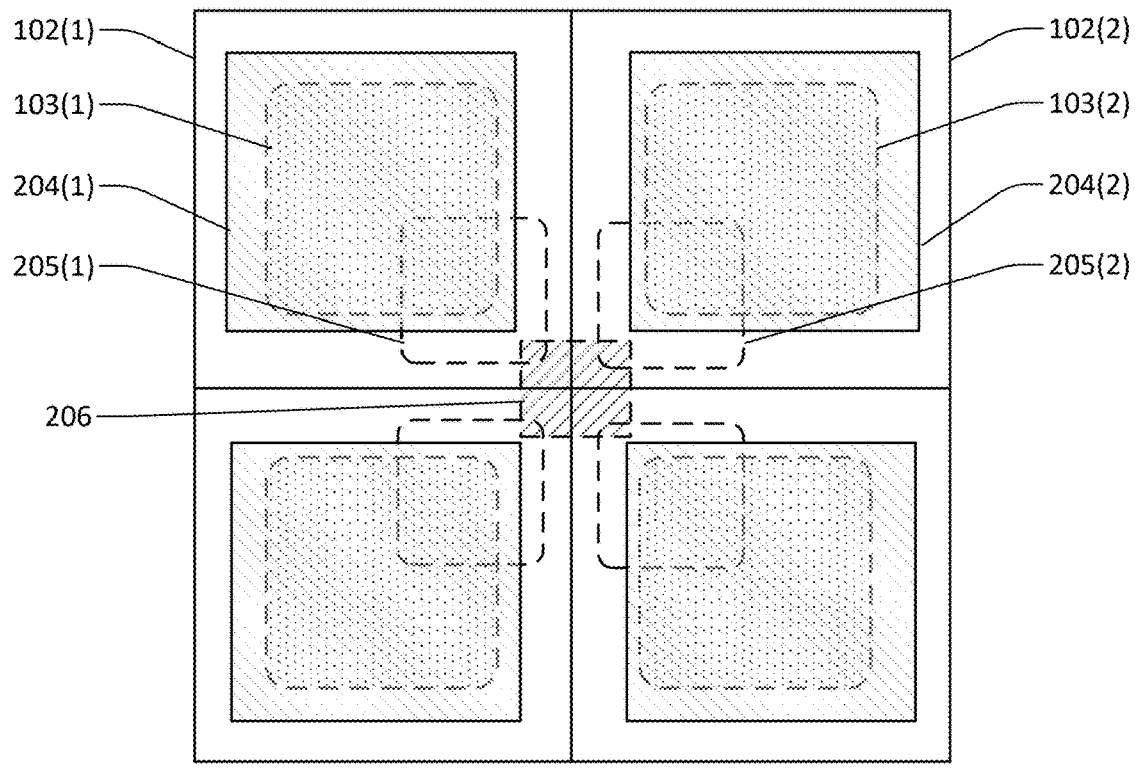
FIG. 2 illustrates a simplified top view of an example foursome of pixel elements in accordance with some embodiments of the disclosure.

FIG. 2 illustrates a simplified top view of an example foursome 201 of pixel elements 102 in accordance with some embodiments of the disclosure. The foursome 201 may correspond to the foursome 101(1) of FIG. 1. For clarity and simplicity, only the elements of pixel elements 102(1) and 102(2) are labeled in the figure; the other pixel elements 102 of the foursome 201 are substantially identical, except as described below in reference to their respective color filters (not shown in FIG. 2). A pixel element 102 comprises a photodetector 103, a photodetector gate electrode 205, a portion of a shared floating diffusion (FD) node 206, and a capacitor 204. For example, pixel element 102(2) comprises photodetector 103(2), photodetector gate electrode 205(2), capacitor 204(2), and a portion of FD node 206. The footprint of the capacitor 204 is more than half of the footprint of the corresponding pixel element 102. Notably, in the example foursome 201 illustrated, the footprint of the capacitor 204 also covers the entirety of the footprint of the corresponding photodetector 103. In some implementations, the footprint of the capacitor may be between approximately 70% and approximately 90% of the footprint of the pixel element and can be between approximately 110% and approximately 160% of the footprint of the photodiode, which provides a useful balance between the benefit of providing protection for the underlying photodetector 103 and the drawbacks of occupation of additional volume that may be used by other IC components and of potential parasitic effects of a larger capacitor.

Figure 3:
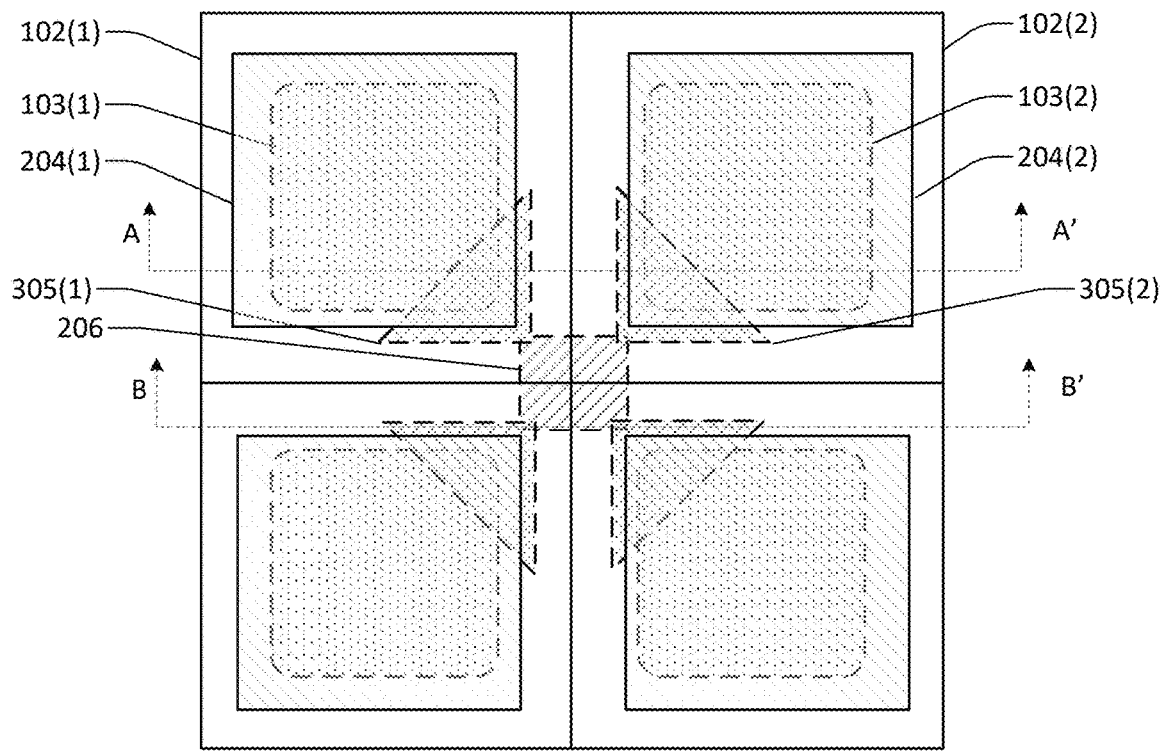
FIG. 3 illustrates a simplified top view of an alternative example foursome of pixel elements in accordance with some embodiments of the disclosure.

FIG. 3 illustrates a simplified top view of an alternative example foursome 301 of pixel elements 102 in accordance with some embodiments of the disclosure. The foursome 301 may correspond to the foursome 101(1) of FIG. 1. For clarity and simplicity, only the elements of pixel elements 102(1) and 102(2) are labeled in the figure; the other pixel elements 102 of the foursome 301 are substantially identical, except as described below in reference to their respective color filters (not shown in FIG. 3). The example pixel element 102(2) of the foursome 301 comprises photodetector 103(2), photodetector gate electrode 305(2), capacitor 204(2), and a portion of FD node 206. While the photodetector gate electrodes 205 of the foursome 201 in FIG. 2 are substantially rectangular (e.g., having a footprint in the form of a rounded rectangle), the photodetector gate electrodes 305 of the foursome 301 are substantially triangular (e.g., having a footprint that is a triangle). The triangular shape of photodetector gate electrode 305 provides sufficient overlap area for the photodetector 103 while freeing up space on the die for additional components. As in pixel elements 102 of the foursome 201 of FIG. 2, the footprint of the capacitor 204 is more than half of the footprint of the corresponding pixel element 102 and, additionally, in the example foursome 301 illustrated, the footprint of the capacitor 204 also covers the entirety of the footprint of the corresponding photodetector 103. Note that the pixel element 102 comprises additional elements that will be illustrated in cross-sections below, but which are omitted here for clarity.

Figure 4A:
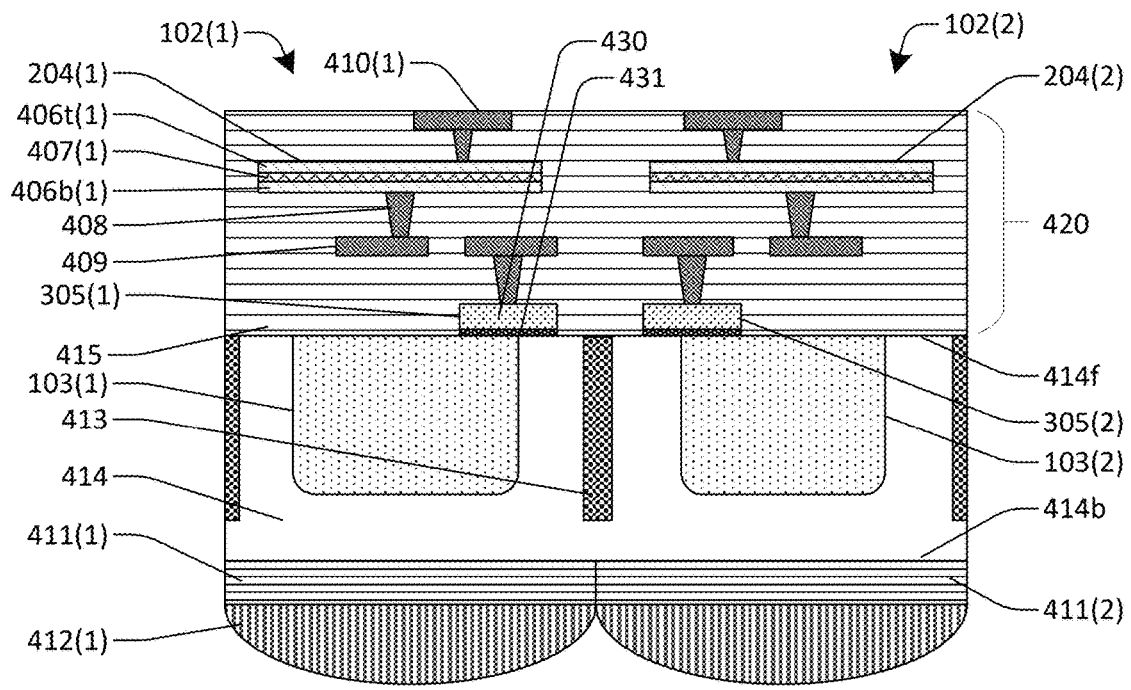
FIG. 4A illustrates a simplified example cross-sectional view of the foursome of FIG. 3 along a first cut line in accordance with some embodiments of the disclosure.

FIG. 4A illustrates a simplified example cross-sectional view of the foursome 301 of FIG. 3 along cut line A-A' of FIG. 3 in accordance with some embodiments of the disclosure. For clarity and simplicity, all the shown features of pixel element 102(1) are labeled while only some of the features of pixel element 102(2) are labeled; the other pixel elements 102 of the foursome 301 are substantially identical, except as described below in reference to their respective color filters 411.

The pixel element 102(1) includes a semiconductor substrate 414 having a front side 414f and a backside 414b. The semiconductor substrate 414 may comprise any suitable semiconductor such as, for example, bulk silicon, and may be doped. The photodetector 103(1) is disposed within the semiconductor substrate 414 on the front side 414f. The photodetector 103(1) may comprise a photodiode comprising a p-type-doped region and an n-type-doped region forming a PN junction. The photodetector 103 is configured to generate charge carriers (e.g., electrons) in response to the absorption of incident photons (e.g., incident from the back side 414b). The pixel element 102(1) may include active devices (not shown) such as transfer and reset transistors to transfer charges accumulated by the photodetector 103(1) in one image-capture interval and to reset the photodetector 103(1) for a subsequent image-capture interval.

An optional color filter 411(1) for the pixel element 102(1) may overlay the backside 414b and an optional optical lens element 412(1) may be arranged on the color filter 411(1) so that the color filter 411(1) is disposed between the optical lens element 412(1) and the photodetector 103(1). Note that, for example, a black-and-white image sensor may forgo having color filters. The optical lens element 412(1) may be a micro-lens and has a generally curved outer surface configured to gather and focus incident light, through the color filter 411(1), for the photodetector 103(1).

The color filter 411(1) filters the incident light to generally allow the passage of light of a particular band of wavelengths but not of others, which is useful for accurately representing colors in the sensed image. The color filter 411(1) may, for example, be a green, red, or blue color filter that allows the passage of, respectively, green, red, or blue light. The color filters of the pixel-element array 100 may be arranged in the Bayer pattern. In the Bayer pattern, a pixel foursome 101, such as example foursomes 201 and 301, comprises two green color filters 411, one red color filter 411, and one blue color filter 411, where the two green color filters 411 are arranged diagonally opposite (or catty-corner), and the foursome pattern is regularly repeated throughout the pixel-element array. After an image is captured by the variously filtered pixel elements, interpolation techniques may be used to generate complete green, red, and blue images spanning the entire pixel array.

Returning to the front side 414f, an interconnect structure 420 is arranged on the front side 414f of the substrate 414. The interconnect structure 420 includes photodetector gate electrodes 305 and capacitors 204-such as photodetector gate electrode 305(1) and capacitor 204(1) in the portion of the interconnect structure 420 of pixel element 102(1)—as well as example metallization lines 409, conductive vias 408, conductive contacts 410, one or more layers of dielectric material 415, and any additional suitable front-end-of-line (FEOL) and back-end-of-line (BEOL) features (not shown). Dielectric material 415 may be interlayer dielectric (ILD) material comprising, for example, low-k dielectrics (e.g., a dielectric material with a dielectric constant less than about 3.9), oxides (e.g., $SiO_2$), nitrides (e.g., SiN), carbides (e.g., SiC), oxy-nitrides (e.g., SiON), oxy-carbides (e.g., SiOC), undoped silicate glass (USG), doped silicon dioxide (e.g., carbon doped silicon dioxide), borosilicate glass (BSG), phosphoric silicate glass (PSG), borophosphosilicate glass (BPSG), fluorinated silicate glass (FSG), a spin-on glass (SOG), or the like. The metallization lines 409, conductive vias 408, and conductive contacts 410 may comprise metal such as, for example, copper, aluminum, or tungsten, or the like.

A photodetector gate electrode 305 may comprise a gate conductive section 430 and a gate dielectric section 431. The gate conductive section 430 may comprise doped polysilicon ("poly") or, alternatively, a metal material such as aluminum, titanium, tantalum, tungsten, another metal material, or any combination of the foregoing. The gate dielectric section 431 may comprise, for example, silicon dioxide ($SiO_2$), silicon nitride ($Si_3N_4$), silicon oxynitride, carbon doped silicon oxide, other suitable dielectric materials, or combinations thereof. The photodetector gate electrode 305 may control flow of charge carriers (e.g., electrons) generated by photons absorbed by the photodetector 103 to the charge-collecting capacitor 204 during an image-capture interval. In some implementations, the photodetector gate electrode 305 may comprise a polysilicon gate.

A capacitor 204, such as capacitor 204(1), may be a metal-insulator-metal (MIM) capacitor comprising a top electrode 406t (1), a corresponding bottom electrode 406b (1), and an insulator layer 407(1) interposed therebetween. MIM capacitors might provide particular benefits in HDR applications as their greater capacitance can help prevent image blooming in bright light conditions, where charge carriers can overflow from saturated pixel elements into adjacent pixel elements. The electrodes 406 may be metallic plates comprising aluminum, copper, ruthenium, tungsten, titanium nitride, tantalum nitride, another conductive material, or any combination of the foregoing. In some implementations, the thickness of the top electrode 406t and the bottom electrode 406b may be between approximately 300 angstroms and approximately 500 angstroms. The insulator layer 407 may comprise high-k dielectric material, such as, for example, hafnium oxide ($HfO_2$), zirconium oxide ($ZrO_2$), aluminum oxide ($Al_2O_3$), hafnium silicon oxide (HfSiO), hafnium silicon oxynitride (HfSiON), hafnium tantalum oxide (HfTaO), hafnium titanium oxide (HfTiO), hafnium titanium tantalum oxide (HfTiTaO), hafnium aluminum oxynitride (HfAlON), hafnium zirconium oxide (HfZrO), other suitable high-k dielectric materials, or combinations thereof. In some implementations, the thickness of the insulator layer 407 may be between approximately 50 angstroms and approximately 100 angstroms.

In some alternative implementations, the capacitors may be 3-dimensional MIM (3DMIM) capacitors (not shown), where their cross-section is not a flat layer, but rather a corrugated, folded, crenelated, serrated, comb-toothed, pectinate, notched, or similarly shaped.

The footprints, however, would remain substantially the same, similarly providing protection to the underlying photodetectors 103 from plasma damage during a dry etching process.

Pixel elements 102 of the pixel array 100 may be separated from each other by isolation structures such as example isolation structures 413 interposed between adjoining pixel elements 102. Isolation structures 413 reduce interference between adjoining pixel elements, reducing deleterious electromagnetic phenomena such as latch-up, cross-talk, leakage currents, and the like. The isolation structures 413 may be simple trenches filled with insulating dielectric material or may be more-elaborate trench structures comprising layers and/or segments of variously doped polysilicon material, metallic structures, and/or dielectric material, where the doped polysilicon material and/or metallic structures may be biased to enhance isolation. FIG. 4A shows isolation structures 413 within the semiconductor substrate 414, however alternative implementations are not so limited. In some alternative implementations of pixel-element foursome 301, isolation structures may extend into the interconnect structure 420. In some alternative implementations of foursome 301, isolation structures may extend past the back side 414b of the substrate 414 and may, for example, separate adjoining color filters 411 and may also, for example, separate adjoining optical lens elements 412.

Figure 4B:
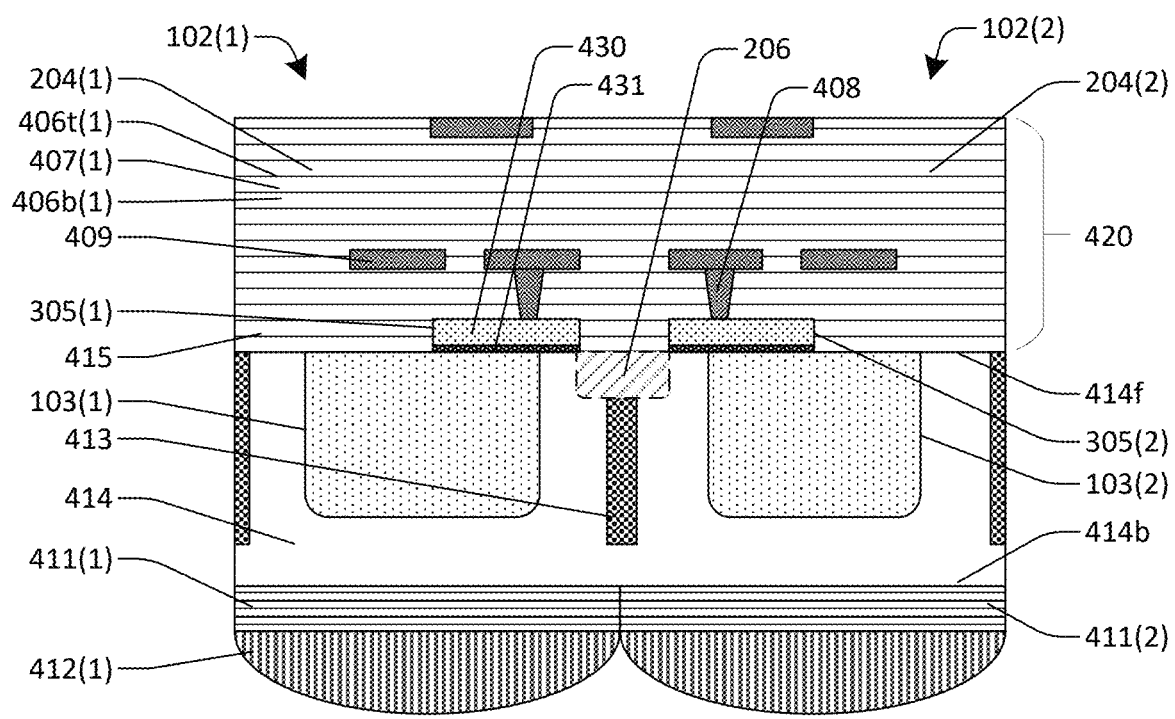
FIG. 4B illustrates a simplified example cross-sectional view of the foursome of FIG. 3 along a second cut line in accordance with some embodiments of the disclosure.

FIG. 4B illustrates a simplified example cross-sectional view of the foursome 301 of FIG. 3 along cut line B-B' of FIG. 3 in accordance with some embodiments of the disclosure. This cross-sectional view illustrates the shared floating diffusion (FD) node 206 that is shared among the four pixel elements 102(1)-(4) of the foursome 301. The FD node 206 may be a suitably doped region of the substrate 414 and/or of grown or deposited semiconductor material. Note that the isolation structure 413 is different by (e.g., under) the FD node 206 and may include more or fewer features (not shown) than in other sections.

The FD node 206 may be conductively connected (not shown) to the capacitors 204 by conductive vias 408 and metallization lines 409. The foursome 301 may be configured to read the value of a particular pixel element 102 by enabling the corresponding photodetector gate 305 (e.g., gate 305(1)) while disabling the other photodetector gates (e.g., gates 305(2), 305(3), and 305(4)) to transfer charge from the selected photodetector (e.g., photodetector 103(1)) to the FD node 206 and, from there, to a capacitor 204. Then to read a value of a next pixel element 102, the FD node 206 may be reset (e.g., by clearing the charge on the FD node 206) and the photodetector gate 305 for the next pixel element 102 is enabled while the others' gates are disabled, and so forth.

Figure 5:
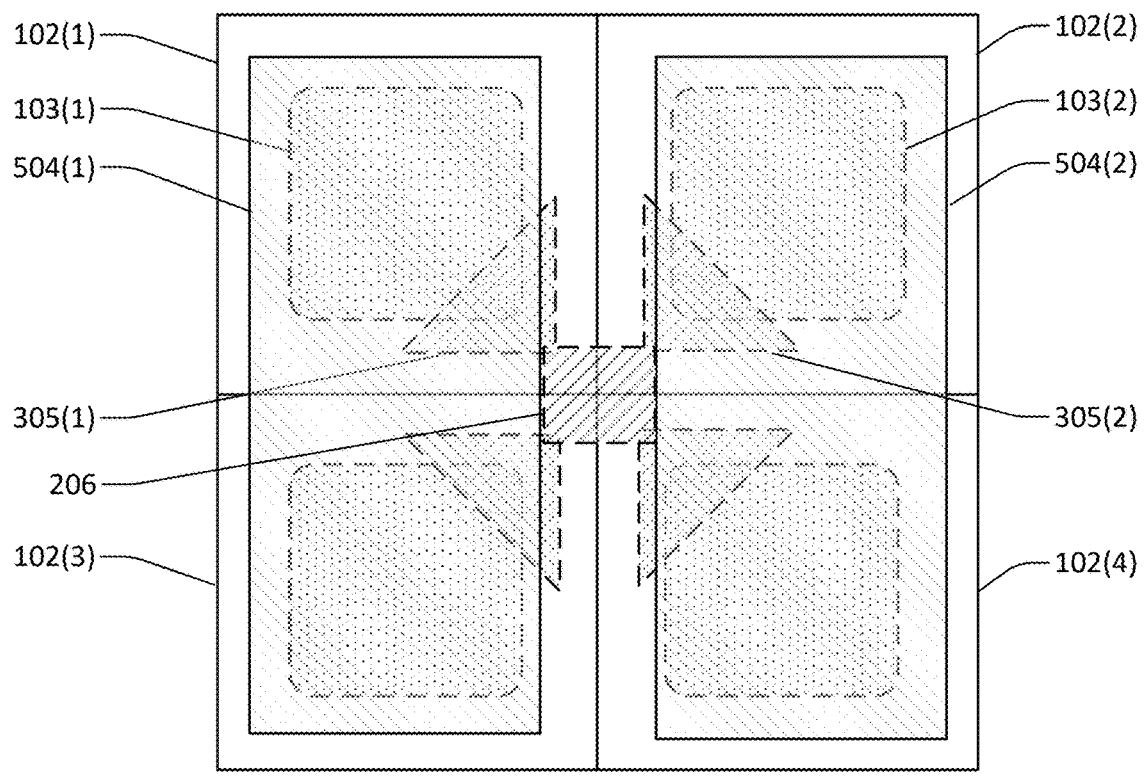
FIG. 5 illustrates a simplified top view of an alternative example foursome of pixel elements in accordance with some embodiments of the disclosure.

FIG. 5 illustrates a simplified top view of an alternative example foursome 501 of pixel elements 102 in accordance with some embodiments of the disclosure. The foursome 501 may correspond to a foursome 101 of the pixel-element array 100 of FIG. 1. Pixel-element foursome 501 comprises pixel elements 102(1), 102(2), 102(3), and 102(4) in which pixel elements 102(1) and 102(3) share a single charge-collecting capacitor 504(1) and pixel elements 102(2) and 102(4) share charge-collecting capacitor 504(2). The pair of adjoining pixel elements 102(1) and 102(3) may form a dual photo-diode (DPD) pair configured for phase detection auto-focus. Similarly, the pair of adjoining pixel elements 102(2) and 102(4) may also form a DPD pair configured for phase detection auto-focus. As illustrated, the footprint of the capacitor 504 covers more than half of the footprint of the corresponding pair of pixel elements 102.

Figure 6:
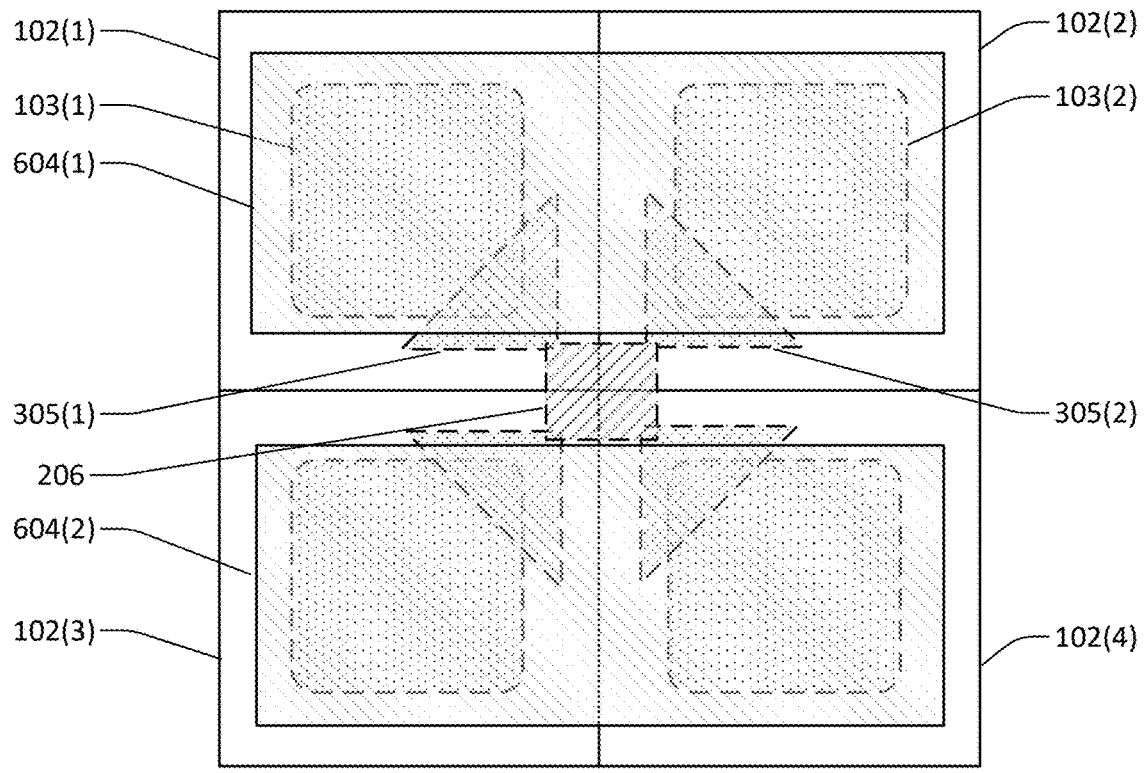
FIG. 6 illustrates a simplified top view of an alternative example foursome of pixel elements in accordance with some embodiments of the disclosure.

FIG. 6 illustrates a simplified top view of an alternative example foursome 601 of pixel elements 102 in accordance with some embodiments of the disclosure. The foursome 601 may correspond to a foursome 101 of the pixel-element array 100 of FIG. 1. Pixel-element foursome 601 comprises pixel elements 102(1), 102(2), 102(3), and 102(4) in which pixel elements 102(1) and 102(2) share a single charge-collecting capacitor 604(1) and pixel elements 102(3) and 102(4) share charge-collecting capacitor 604(2). The pair of adjoining pixel elements 102(1) and 102(2) may form a DPD pair configured for phase detection auto-focus. Similarly, the pair of adjoining pixel elements 102(3) and 102(4) may also form a DPD pair configured for phase detection auto-focus. As illustrated, the footprint of the capacitor 604 covers more than half of the footprint of the corresponding pair of pixel elements 102.

Figure 7:
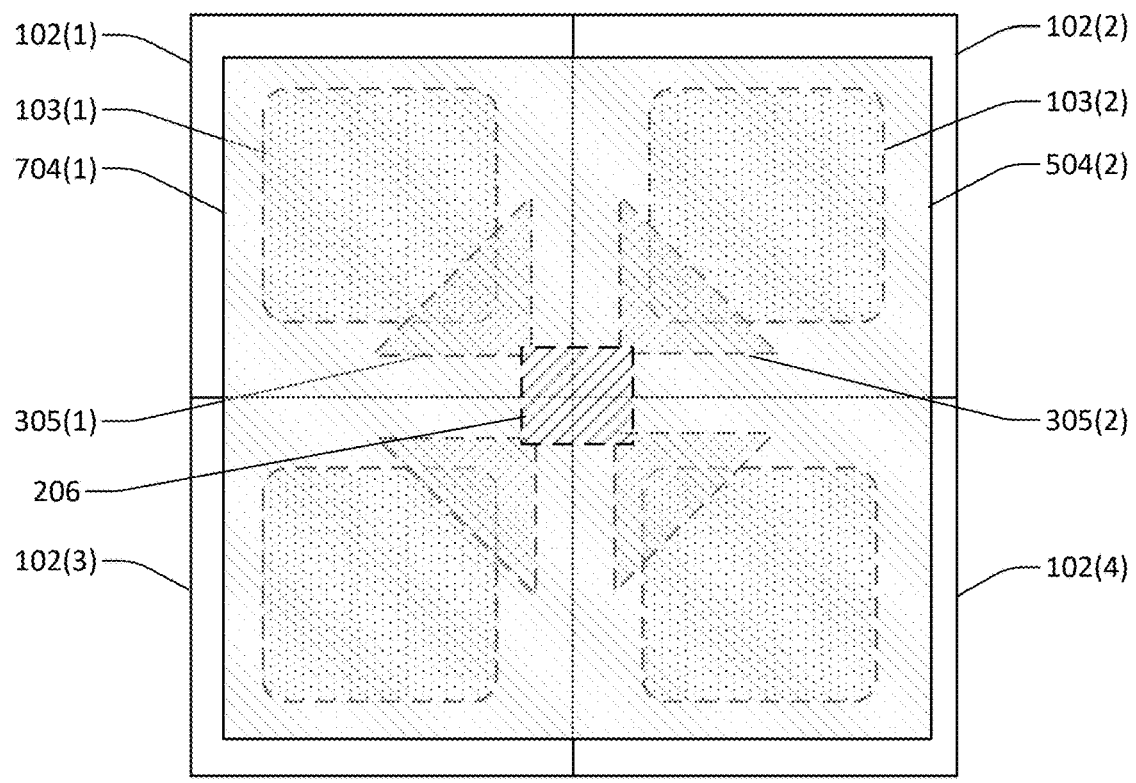
FIG. 7 illustrates a simplified top view of an alternative example foursome of pixel elements in accordance with some embodiments of the disclosure.

FIG. 7 illustrates a simplified top view of an alternative example foursome 701 of pixel elements 102 in accordance with some embodiments of the disclosure. The foursome 701 may correspond to a foursome 101 of the pixel-element array 100 of FIG. 1. Pixel-element foursome 701 comprises pixel elements 102(1), 102(2), 102(3), and 102(4) in which the four pixel elements share a single charge-collecting capacitor 704(1) and pixel elements 102(3) and 102(4) share charge-collecting capacitor 604(2).704(1). The 2×2 array of four pixel elements 102(1)-(4) may form a quad photo-diode (QPD) set configured for phase detection auto-focus. As illustrated, the footprint of the capacitor 704(1) covers more than half of the footprint of the corresponding foursome of pixel elements 102.

Figure 8:
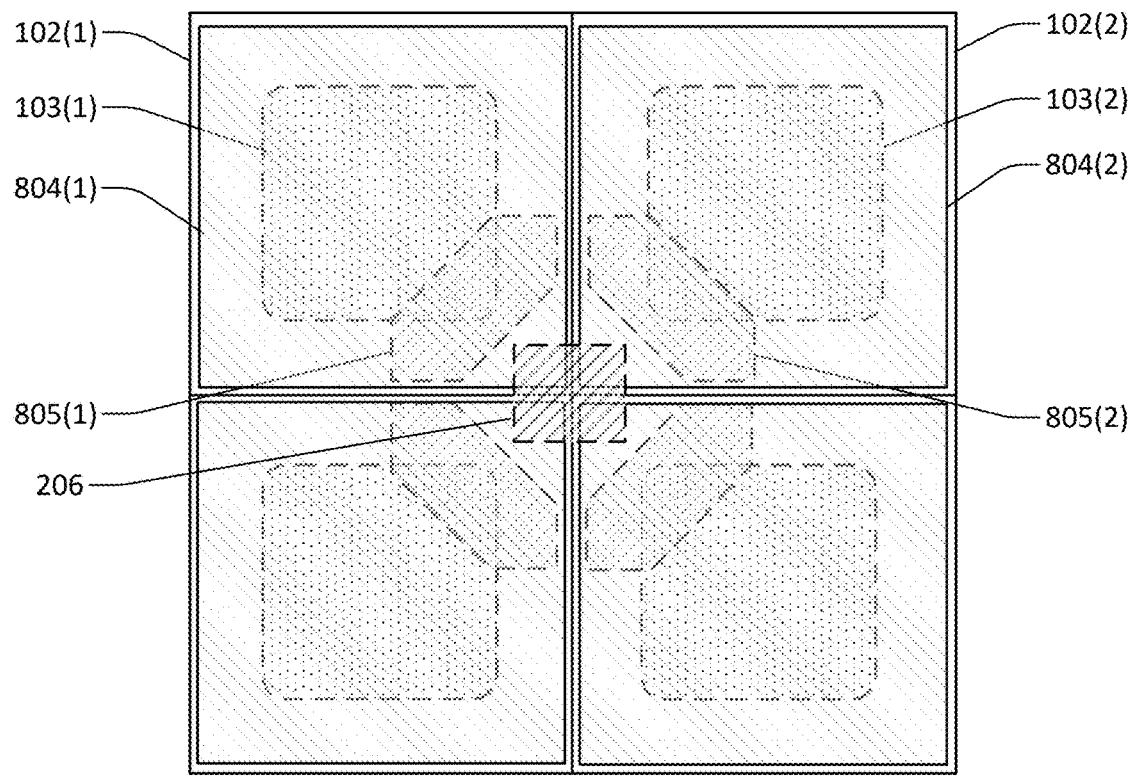
FIG. 8 illustrates a simplified top view of an alternative example foursome of pixel elements in accordance with some embodiments of the disclosure.

FIG. 8 illustrates a simplified top view of an alternative example foursome 801 of pixel elements 102 in accordance with some embodiments of the disclosure. The foursome 801 may correspond to a foursome 101 of the pixel-element array 100 of FIG. 1. Pixel-element foursome 801 comprises pixel elements 102(1), 102(2), 102(3), and 102(4) in which photodetector gate electrodes 805 are employed instead of the photodetector gate electrodes 205 or 305 of pixel-element foursomes 201, 301, 501, 601, and 701. Specifically, photodetector gate electrodes 805 are hexagonally shaped (as seen in a top view or in terms of the footprint) rather than being substantially rectangular or triangular as in some other implementations. In addition, as illustrated, the footprint of each capacitor 804 (e.g., capacitor 804(1)) covers more than 90% of the footprint of the corresponding pixel element (e.g., pixel element 102(1)).

Figure 9:
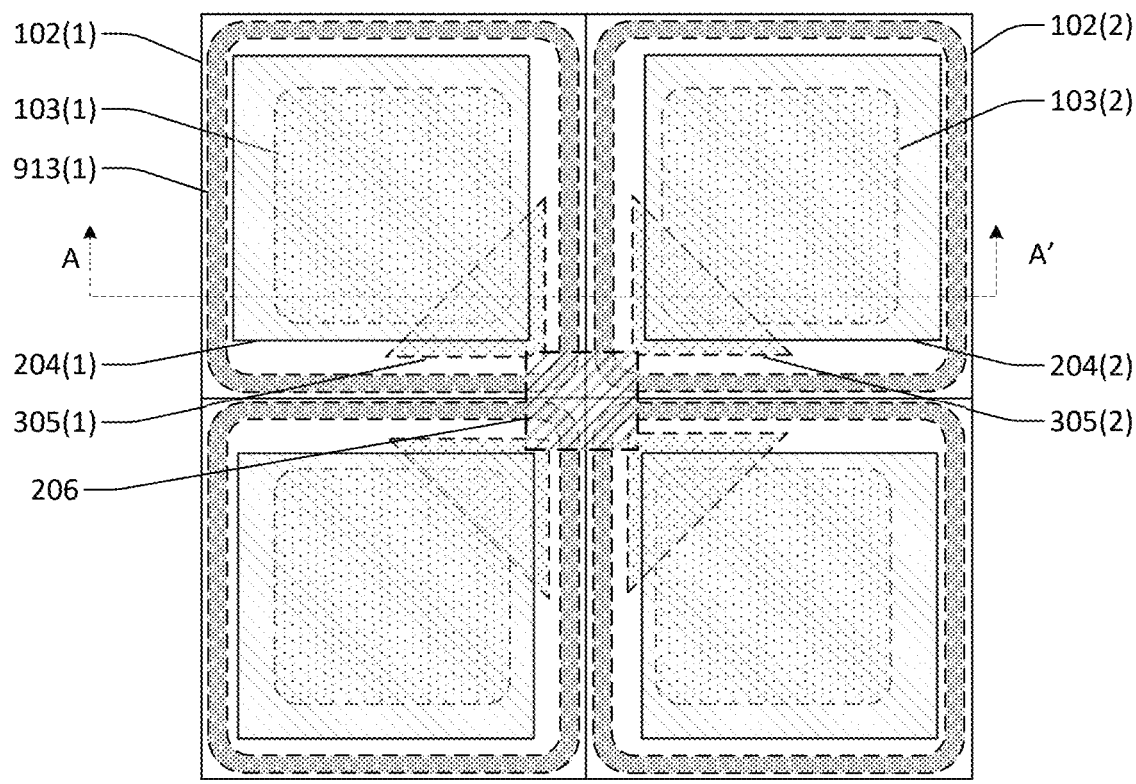
FIG. 9 illustrates a simplified top view of an alternative example foursome of pixel elements in accordance with some embodiments of the disclosure
Figure 10:
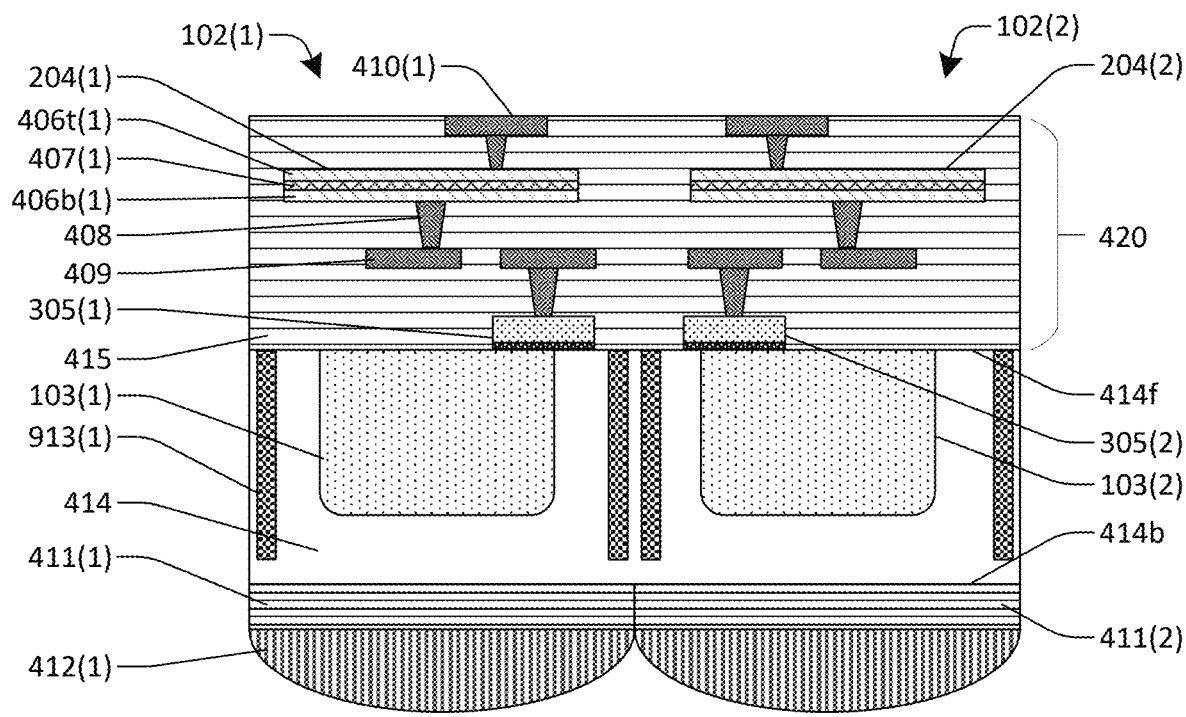
FIG. 10 illustrates a corresponding simplified cross-sectional view of the pixel-element foursome of FIG. 9.

FIG. 9 illustrates a simplified top view of an alternative example foursome 901 of pixel elements 102 in accordance with some embodiments of the disclosure and FIG. 10 illustrates the corresponding simplified cross-sectional view of the pixel-element foursome 901 along the cut line A-A' of FIG. 9. The foursome 901 may correspond to the foursome 101(1) of FIG. 1. For clarity and simplicity, only some elements are individually labeled in the figures; the other pixel elements 102 of the foursome 901 are substantially identical, except as described elsewhere in regards to the respective color filters.

The pixel elements 102 of foursome 901 are substantially similar to the pixel elements 102 of the foursome 301 of FIGS. 3 and 4, except that instead of trench isolation structures 413 separating adjoining pixel elements 102 as in foursome 301, each pixel element 102 of the foursome 901 comprises its own corresponding isolation ring 913. For example, pixel element 102(1) of foursome 901 comprises isolation ring 913(1). The isolation rings 913 may be simple trenches filled with insulating dielectric material or may be more-elaborate trench structures comprising layers and/or segments of variously doped polysilicon material, metallic structures, and/or dielectric material, where the doped polysilicon material and/or metallic structures may be biased to enhance isolation. The isolation rings 913 may extend into the interconnect structure 420 and/or past the back side 414b of the substrate 414.

FIGS. 11-27 illustrate simplified cross-sectional views of various example stages of fabrication of image-sensor pixel elements in accordance with some embodiments of the disclosure. Although FIGS. 11-27 are described as a series of acts, it will be appreciated that these acts are not limiting in that the order of the acts can be altered in other embodiments, and the methods disclosed are also applicable to other structures. In some embodiments, some acts that are illustrated and/or described may be omitted in whole or in part.

In some embodiment, additional acts that are not described herein may also be performed as part of the manufacturing process.

Figure 11:
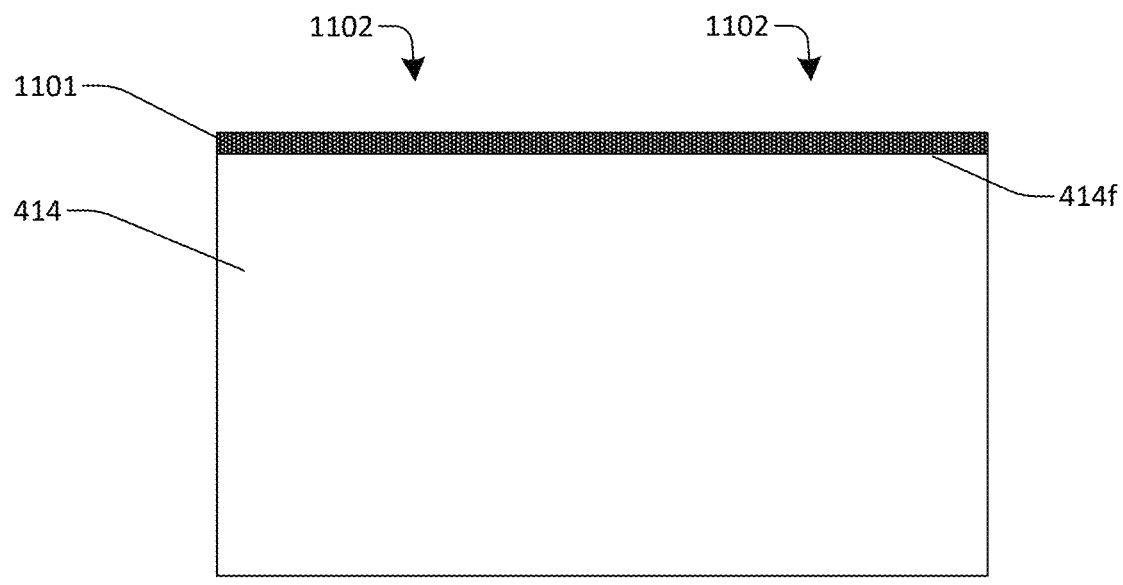
FIGS. 11-27 illustrate simplified cross-sectional views of various example stages of fabrication of image-sensor pixel elements in accordance with some embodiments of the disclosure.

FIG. 11 illustrates a simplified cross-sectional view of a portion 1100 of a wafer comprising a semiconductor substrate 414 overlayed on its front side 414f with a mask layer 1101, which may be a suitable photoresist or hardmask layer that may be deposited via a spin coating process, a deposition process, or the like. In an implementation where the mask layer 1101 comprises a photoresist, a photolithographic process may be executed wherein the mask layer 1101 is selectively exposed to electromagnetic radiation based on a photo mask, whereupon the electromagnetic radiation modifies a solubility of exposed regions of the mask layer 1101 to define soluble regions 1102.

Figure 12:
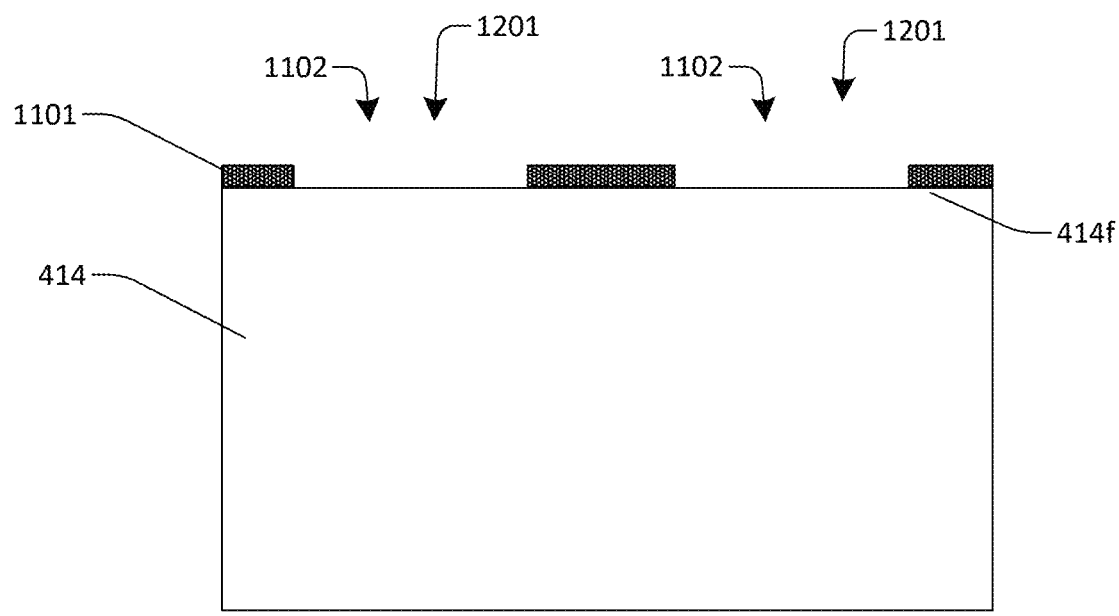

FIG. 12 illustrates a simplified cross-sectional view of a portion 1200, corresponding to the portion 1100 of FIG. 11 after the removal of the soluble regions 1102 of the mask layer 1101 to define openings 1201 in the mask layer 1101 corresponding with the regions 1102. In some embodiments, the regions 1102 may be removed be exposing the mask layer 1101 to a developer that dissolves the regions 1102.

Figure 13:
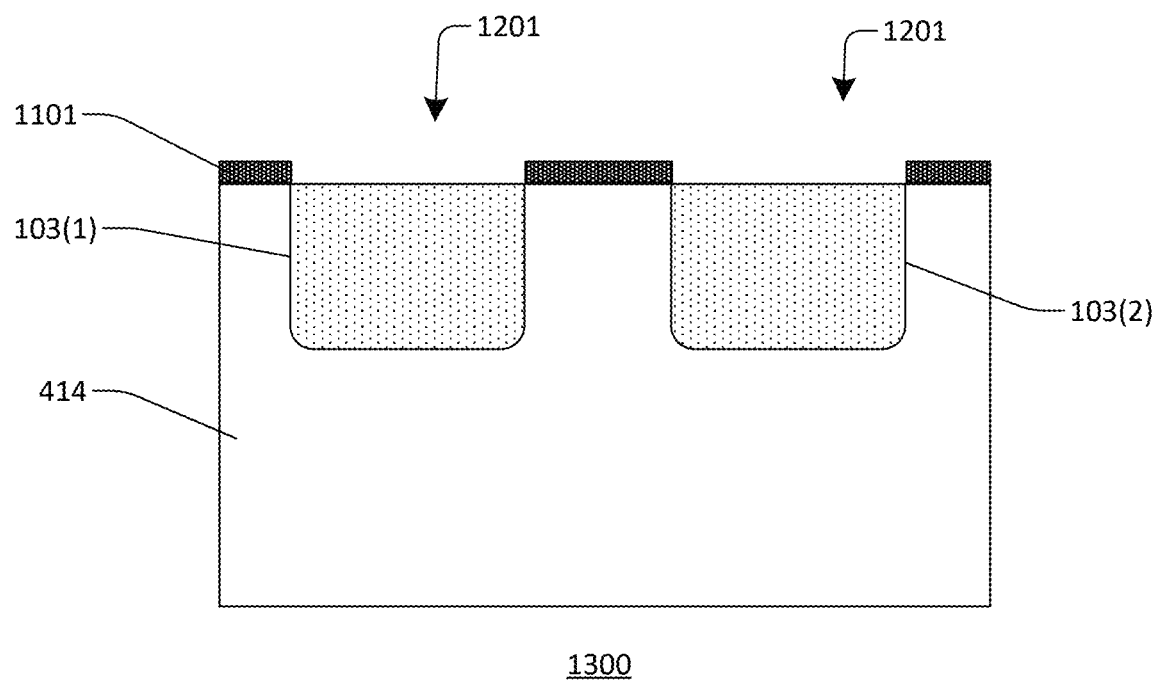

FIG. 13 illustrates a simplified cross-sectional view of a portion 1300, corresponding to the portion 1200 of FIG. 12 after the formation of the photodetectors 103. The photodetectors 103 may be formed by suitably doping the substrate 414 using the openings 1201 in the mask layer 1101. A photodetector 103 may comprise a photodiode formed by implanting one or more dopant species into the front side 414f of the substrate 414. For example, a photodetector 103 may be formed by selectively performing a first implantation process (e.g., according to a masking layer) to form a first region having a first doping type (e.g., n-type), and subsequently performing a second implantation process to form a second region abutting the first region and having a second doping type (e.g., p-type) different than the first doping type. In some embodiments a floating diffusion well (not shown) may also be formed using one of the first or second implantation processes.

Figure 14A:
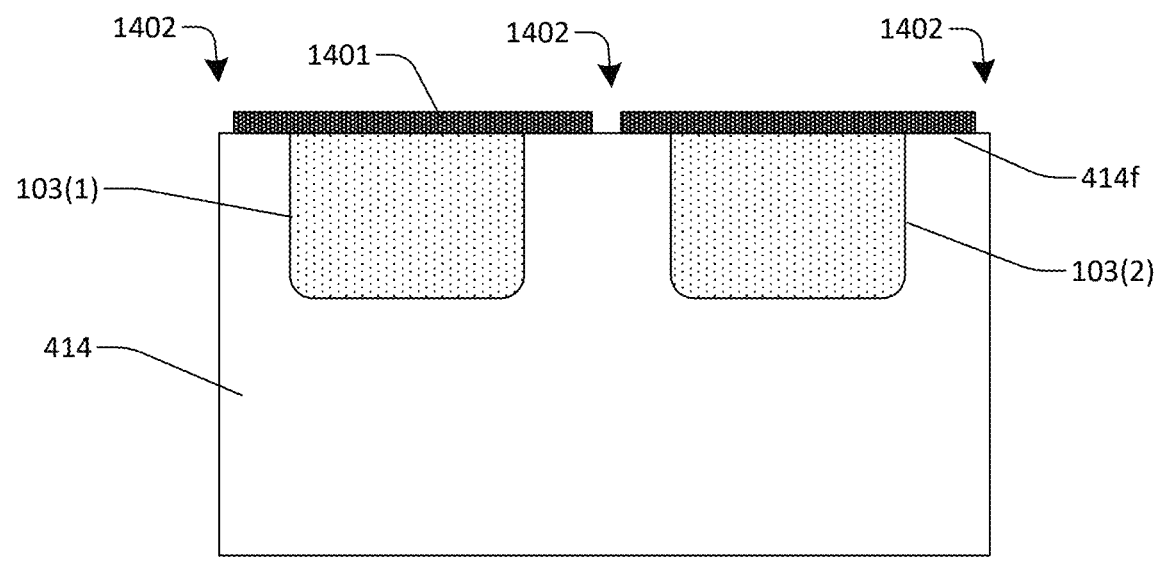

FIG. 14A illustrates a simplified cross-sectional view of a portion 1400, corresponding to the portion 1300 of FIG. 13 after removal of the mask layer 1101 and the formation on front side 414f of mask layer 1401 with openings 1402. The mask layer 1401 and openings 1402 may be formed in any of the ways described above in reference to mask layer 1101 and openings 1201.

Figure 14B:
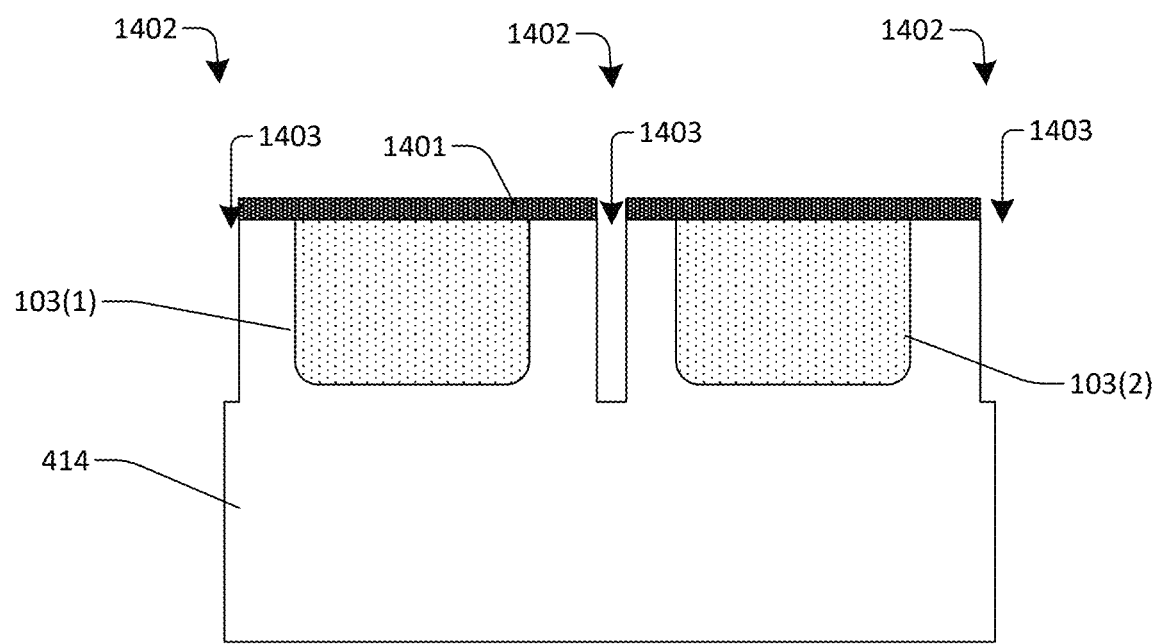

FIG. 14B illustrates a simplified cross-sectional view of the portion 1400 of FIG. 14A after the formation of trenches 1403 defined by the openings 1402 in the mask layer 1401. The trenches 1403 may be formed by, for example, dry etching of the semiconductor substrate 414 with, for example, a dry etchant such as, for example, a gaseous mixture of xenon and fluoride (e.g., $XeF_6$), sulfur and fluoride (e.g., $SF_6$), or some other suitable mixture.

Figure 15:
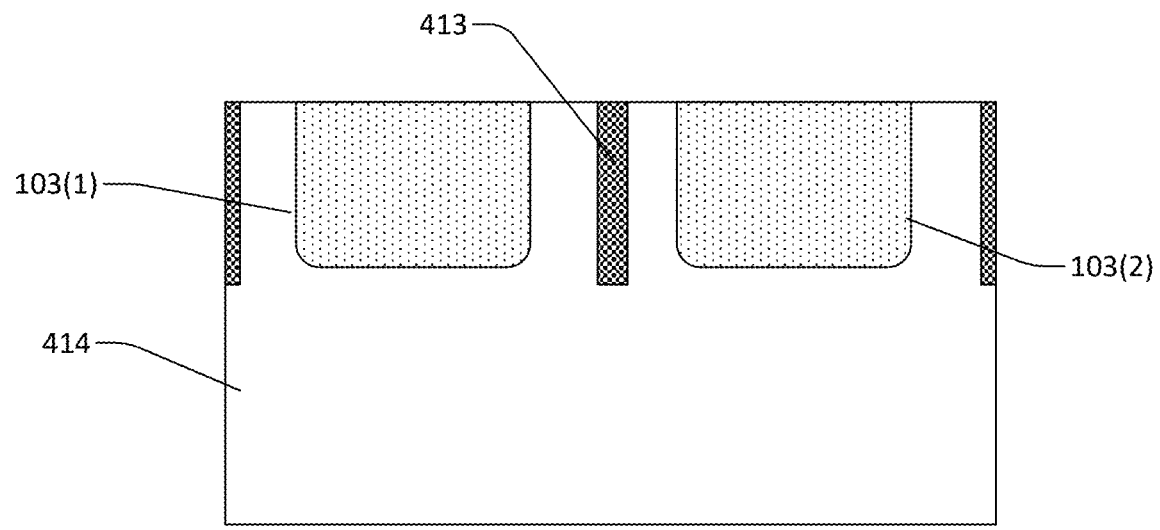

FIG. 15 illustrates a simplified cross-sectional view of a portion 1500, corresponding to the portion 1400 of FIG. 14B following deposition of suitable fill in the trenches 1403 to form the isolation structures 413. The fill may be deposited using, for example, chemical vapor deposition (CVD) or any suitable deposition technique. In some embodiments, after deposition of the fill in the trenches 1403, a planarization process may be performed to remove the masking layer (e.g., 1401 of FIG. 14A) and any part of the fill that is outside of the trenches 1403. In some embodiments, the planarization process may comprise a chemical mechanical planarization (CMP) process, an etching process, or the like.

Figure 16:
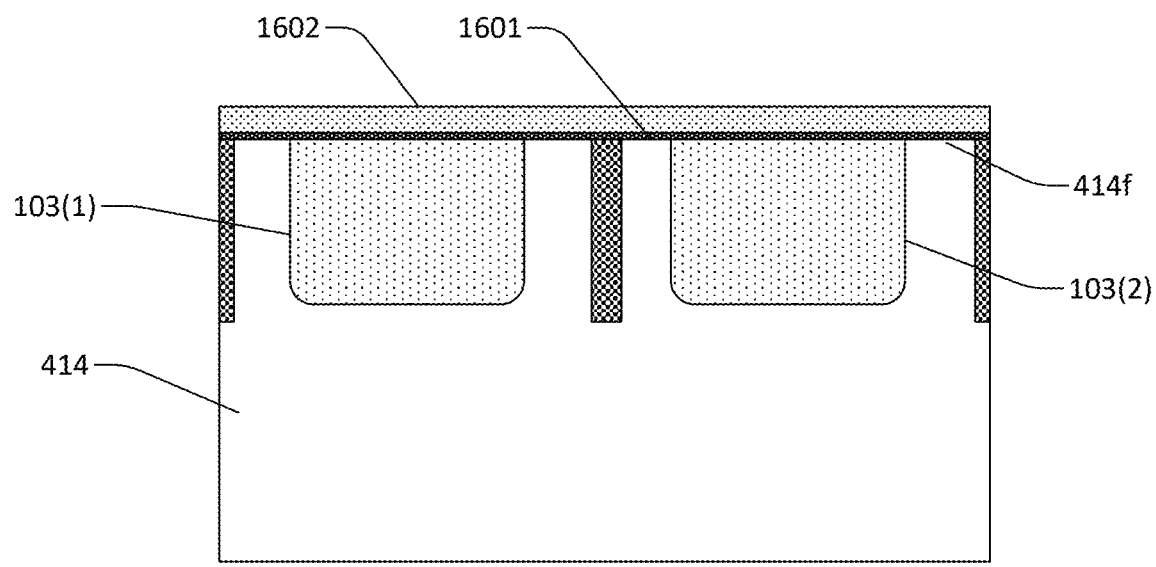

FIG. 16 illustrates a simplified cross-sectional view of a portion 1600, corresponding to the portion 1500 of FIG. 15 following deposition on the front side 414f of a dielectric layer 1601 (comprising, e.g., a high-k dielectric) and a photodetector-gate-electrode-material layer 1602 (comprising, for example, doped polysilicon). The dielectric layer 1601 may be formed by, for example, a CVD process, a physical vapor deposition (PVD) process, or any other suitable growth or deposition process. The gate material layer 1602 may be formed by, for example, a CVD process, a PVD process, or any other suitable growth, deposition, and/or doping process.

Figure 17:
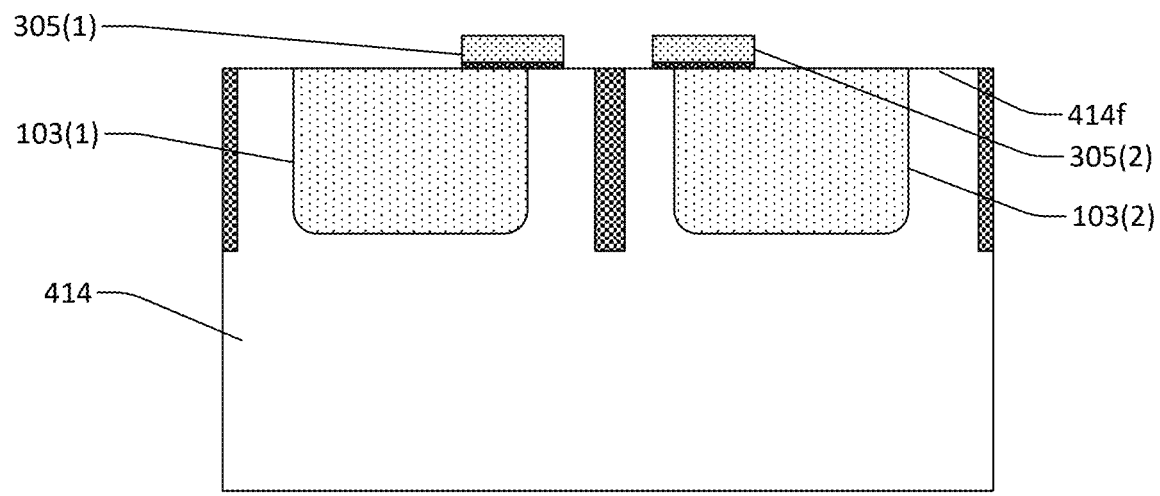

FIG. 17 illustrates a simplified cross-sectional view of a portion 1700, corresponding to the portion 1600 of FIG. 16 following the formation of photodetector gate electrodes 305 from layers 1601 and 1602. The photodetector gate electrodes 305 may be formed by, for example, suitable masking and etching of the layers 1601 and 1602, or any other suitable feature-fabricating process.

Figure 18:
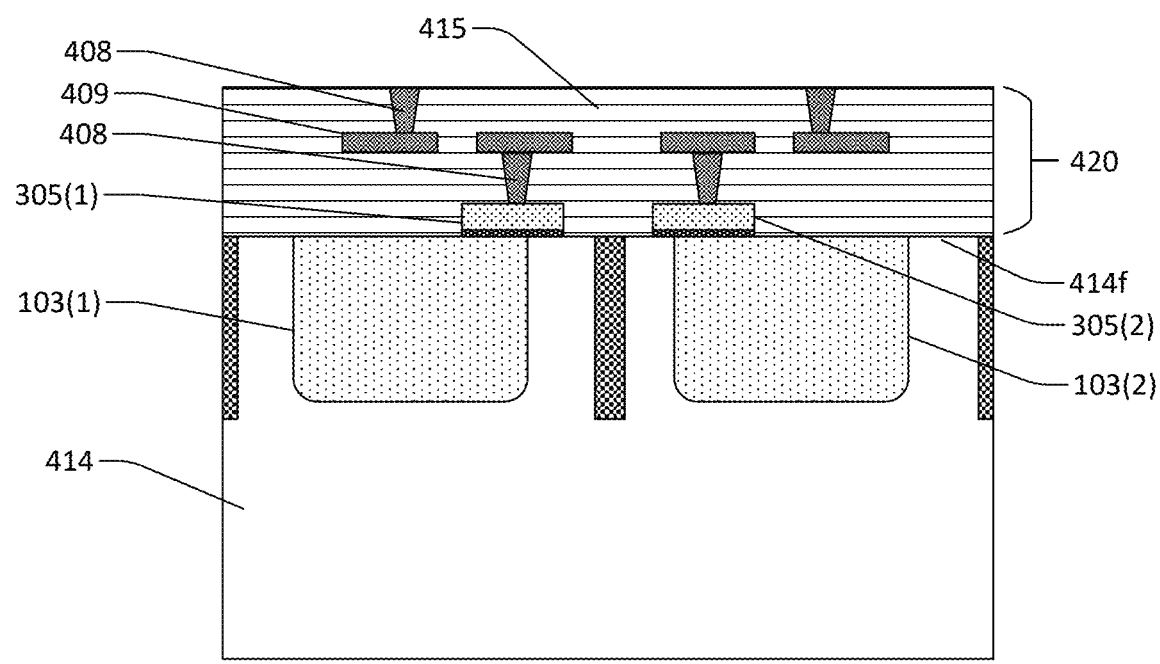

FIG. 18 illustrates a simplified cross-sectional view of a portion 1800, corresponding to the portion 1700 of FIG. 17 following the formation on the front side 414f of some features of interconnect structure 420 such as, for example, one or more layers of dielectric material 415, metallization lines 409, and conductive vias 408. The features may be formed using any suitable deposition, etching, filling, and feature-forming process.

Figure 19:
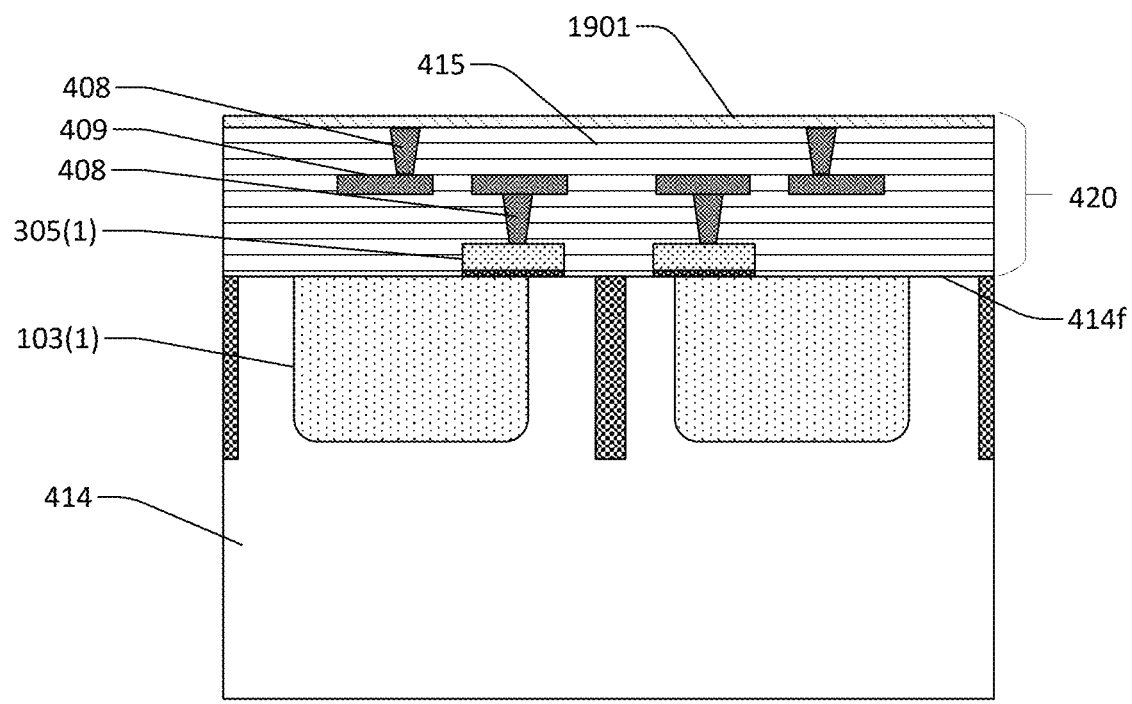

FIG. 19 illustrates a simplified cross-sectional view of a portion 1900, corresponding to the portion 1800 of FIG. 18 following deposition on the front side 414f of a conductive layer 1901. The conductive layer 1901 may comprise metal deposited using, for example, electroplating, CVD, PVD, atomic layer deposition (ALD), or other suitable process.

Figure 20:
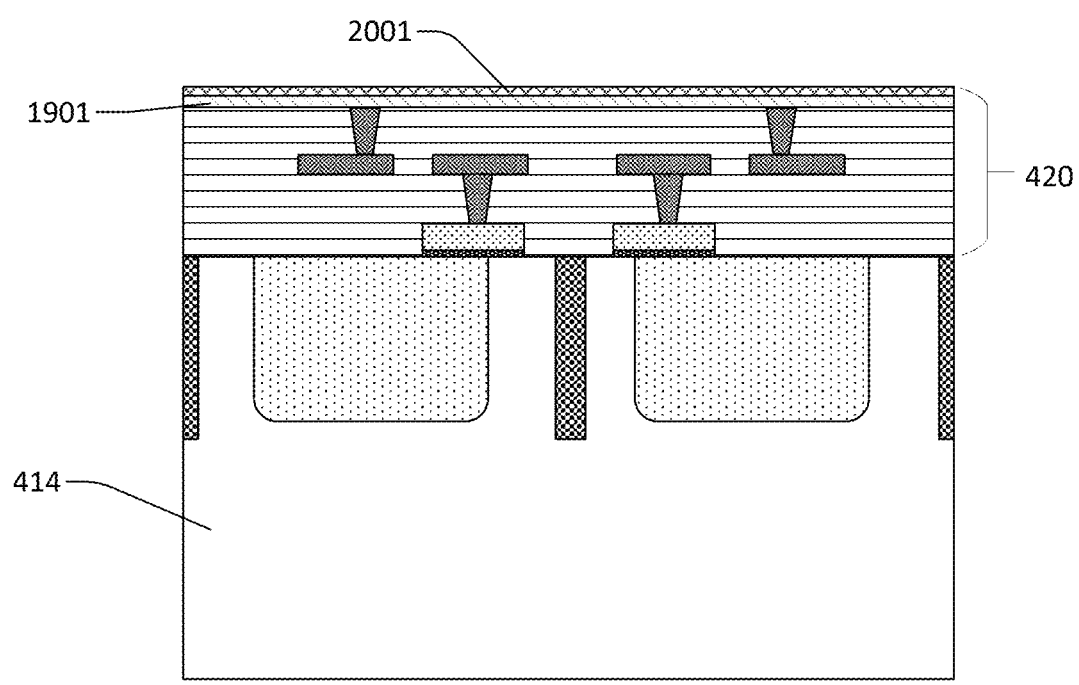

FIG. 20 illustrates a simplified cross-sectional view of a portion 2000, corresponding to the portion 1900 of FIG. 19 following deposition on the front side 414f of a dielectric layer 2001 over the conductive layer 1901, which may be deposited using any suitable deposition process.

Figure 21:
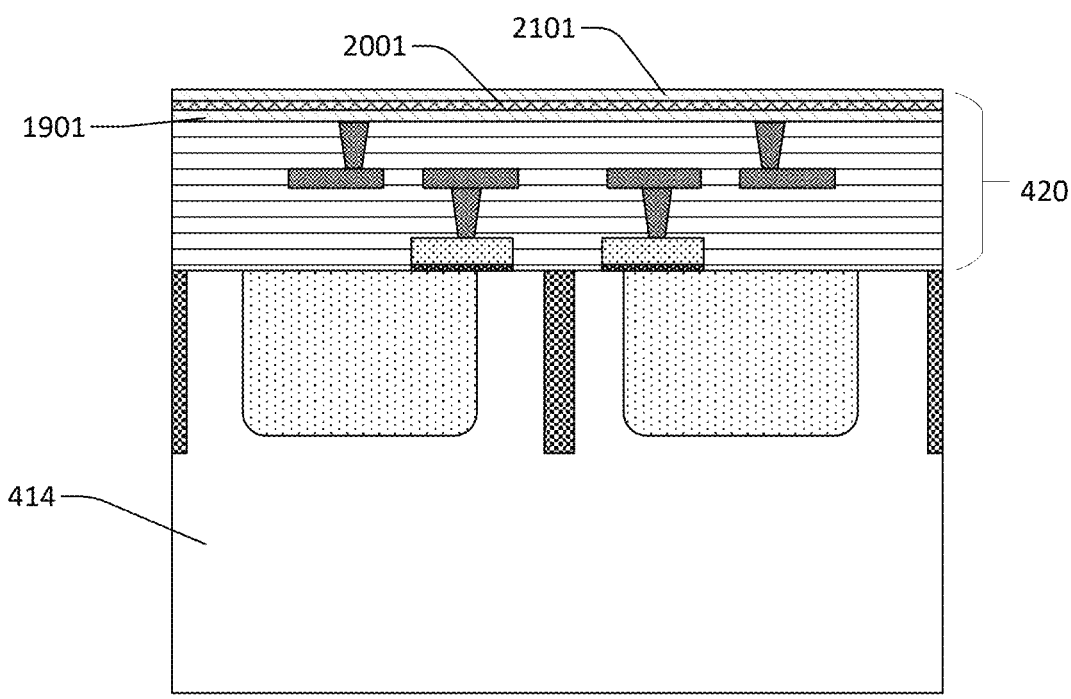

FIG. 21 illustrates a simplified cross-sectional view of a portion 2100, corresponding to the portion 2000 of FIG. 20 following deposition on the front side 414f of a conductive layer 2101 over the dielectric layer 2001, which may be deposited using any suitable deposition process.

Figure 22:
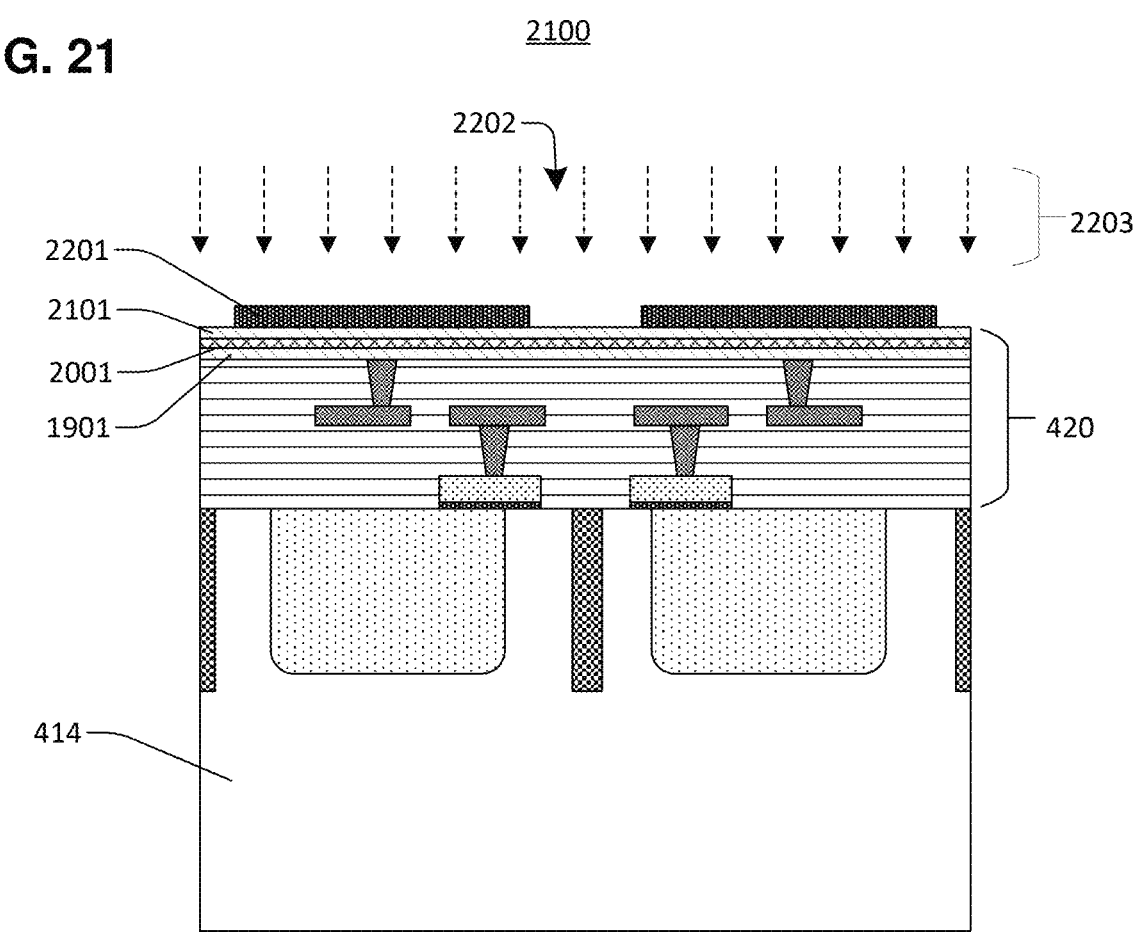

FIG. 22 illustrates a simplified cross-sectional view of a portion 2200, corresponding to the portion 2100 of FIG. 21 following formation on the front side 414f of a mask layer 2201 over conductive layer 2101, the mask layer 2201 having openings such as, for example, opening 2202. The mask layer 2201 is suitable for dry etching conductive layers 1901 and 2101 and dielectric layer 2001 with plasma 2203. The dry etching may be performed in a dry etching chamber using a fluorine-containing gas such as $CF_4$, where a suitable pressure and flow rate may be achieved.

Figure 23:
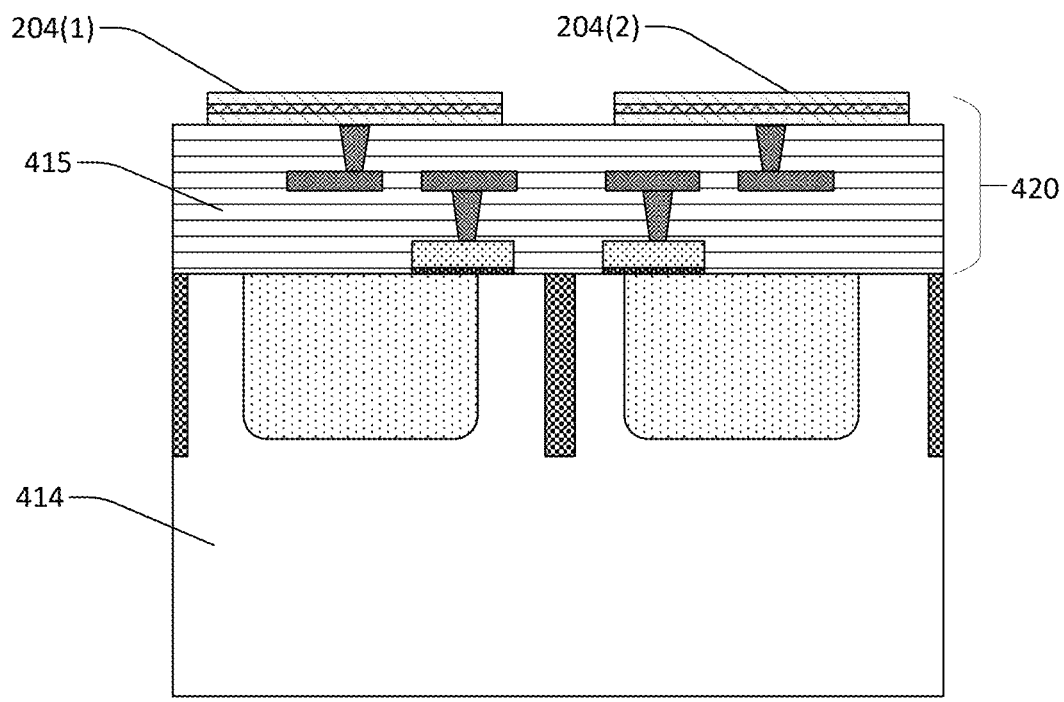

FIG. 23 illustrates a simplified cross-sectional view of a portion 2300, corresponding to the portion 2200 of FIG. 21 following the etching of layers 1901, 2001, and 2101 and the removal of the mask layer 2201, thereby forming capacitors 204.

Figure 24:
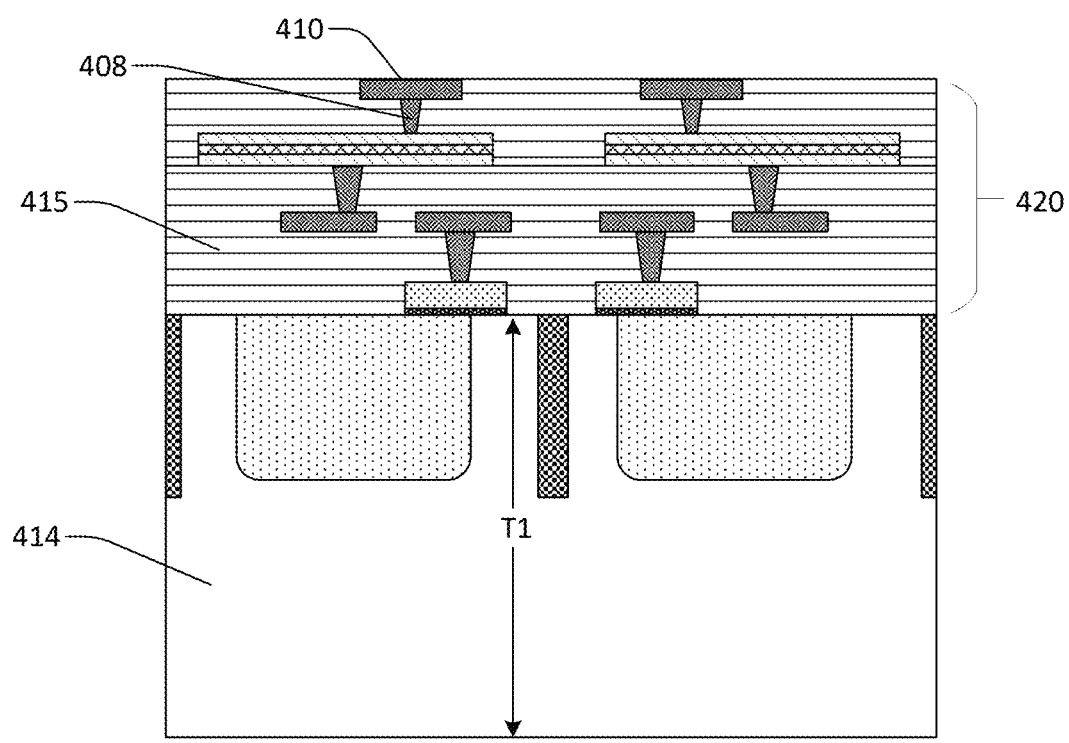

FIG. 24 illustrates a simplified cross-sectional view of a portion 2400, corresponding to the portion 2300 of FIG. 23 following the formation of some additional features of interconnect structure 420 such as, for example, one or more layers of dielectric material 415, conductive vias 408, and conductive contacts 410, which may be formed using any of the suitable corresponding acts described elsewhere herein. Note that the semiconductor substrate 414 in portion 2400 has a thickness of T1.

Figure 25:
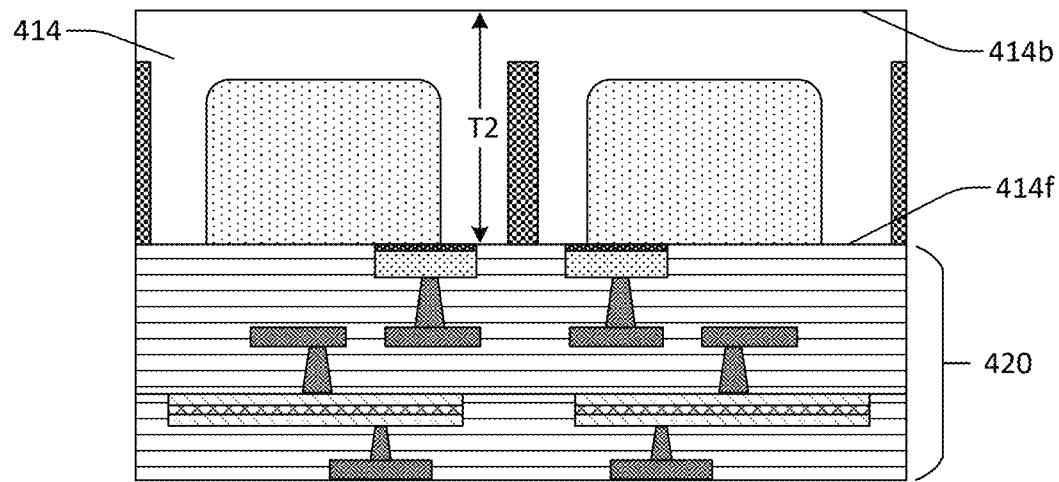

FIG. 25 illustrates a simplified cross-sectional view of a portion 2500, corresponding to the portion 2400 of FIG. 24 following thinning of the semiconductor substrate 414 on the back side 414b to leave the substrate 414 at a thickness T2 that is smaller than T1. The substrate 414 may be thinned by, for example, a suitable grinding process. Note that the portion 2500 is shown reoriented so that the back side 414b is on top and the interconnect structure 420 is at the bottom to correspond to the reorientation of the corresponding wafer in the fabrication process.

Figure 26:
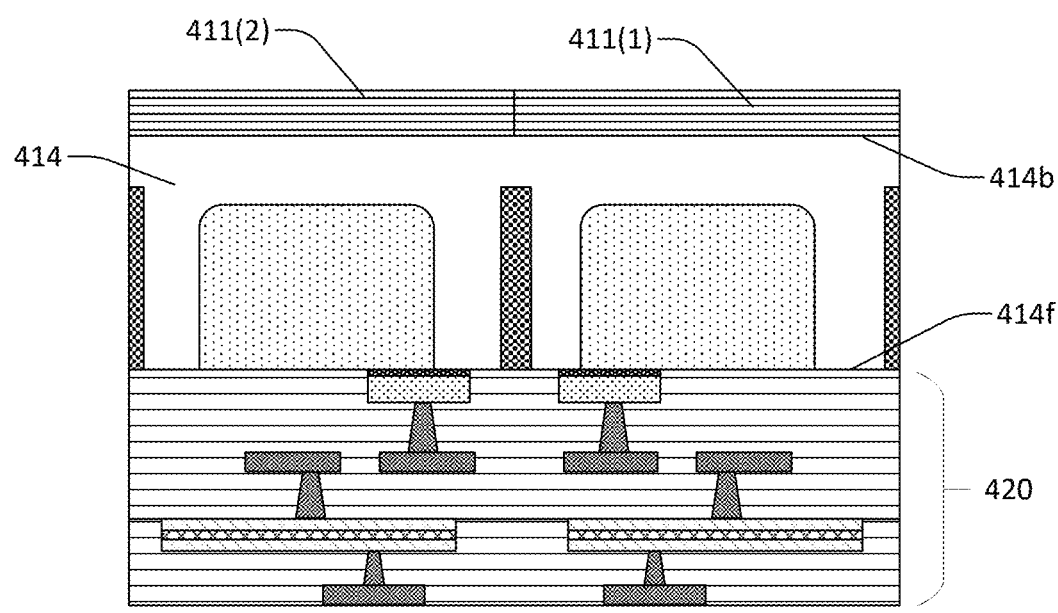

FIG. 26 illustrates a simplified cross-sectional view of a portion 2600, corresponding to the portion 2500 of FIG. 25 following formation of the color filters 411 on the back side 414b.

Figure 27:
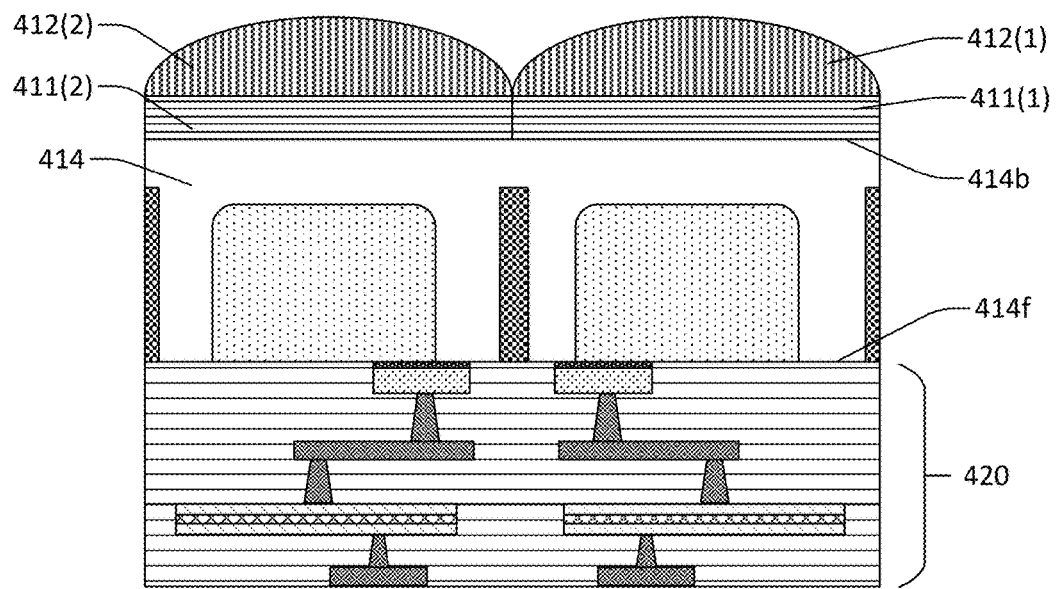

FIG. 27 illustrates a simplified cross-sectional view of a portion 2700, corresponding to the portion 2600 of FIG. 26 following formation of optical lens elements 412 on the back side 414b, over the color filters 411. The portion 2700 may also correspond to the view of pixel-element foursome 301 of FIG. 4A.

Figure 28:
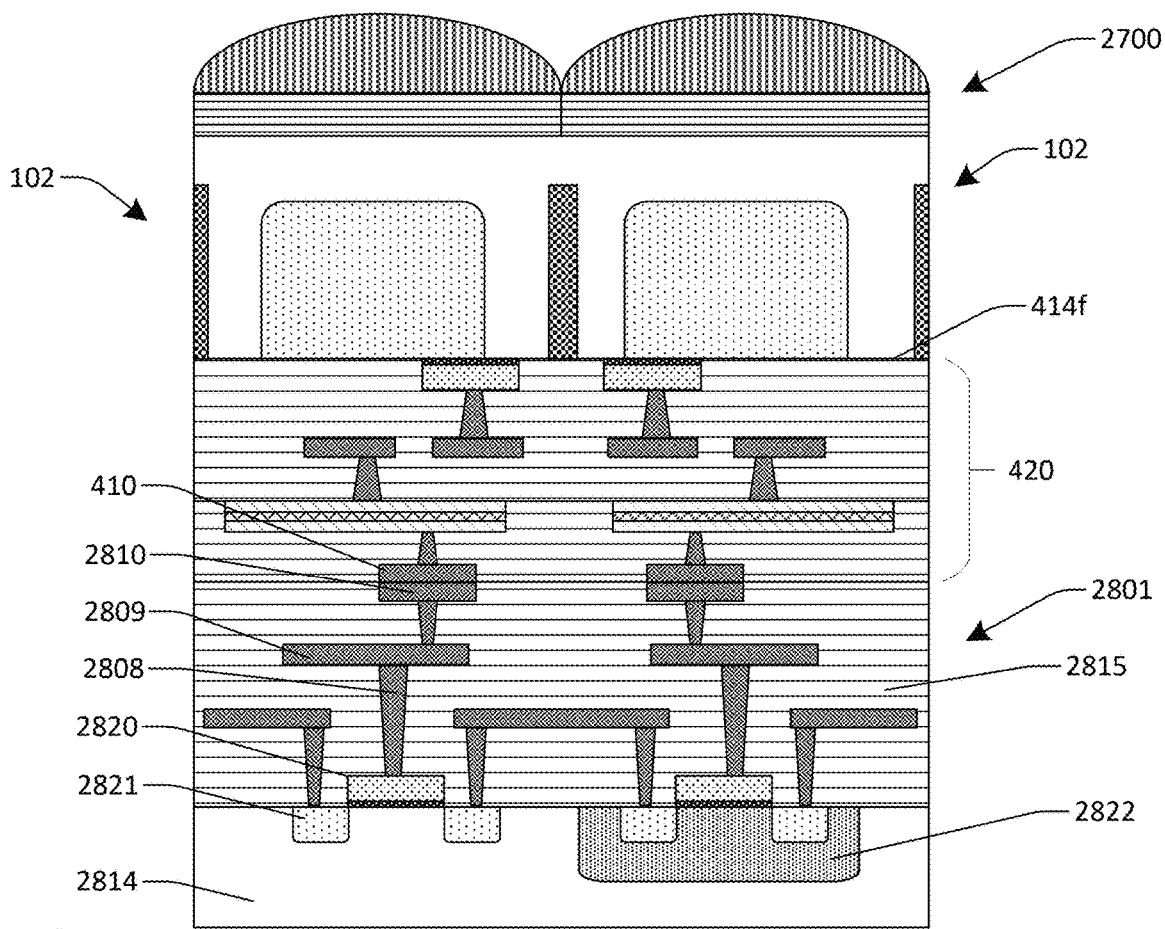
FIG. 28 illustrates a simplified cross-sectional view of a portion corresponding to a segment of a compound device formed by bonding a second IC device to the interconnect structure on the front side of the portion of FIG. 27, in accordance with some embodiments of the disclosure.

FIG. 28 illustrates a simplified cross-sectional view of a portion 2800 corresponding to a segment of a compound device formed by bonding a second IC device 2801 to the interconnect structure 420 on the front side 414f of the portion 2700 of FIG. 27. The second IC device 2801 may provide logic, memory, control, and/or other functionality for pixel elements 102. The second IC device 2801 may comprise a substrate 2814, gate structures 2820, source/drain regions 2821, doped wells 2822, metallic interconnects 2809, conductive vias 2808, conductive contacts 2810, and one or more dielectric layers 2815.

After the above-described wafer processing is completed, the wafer may be singulated into individual die which correspond to individual ICs.

Figure 29:
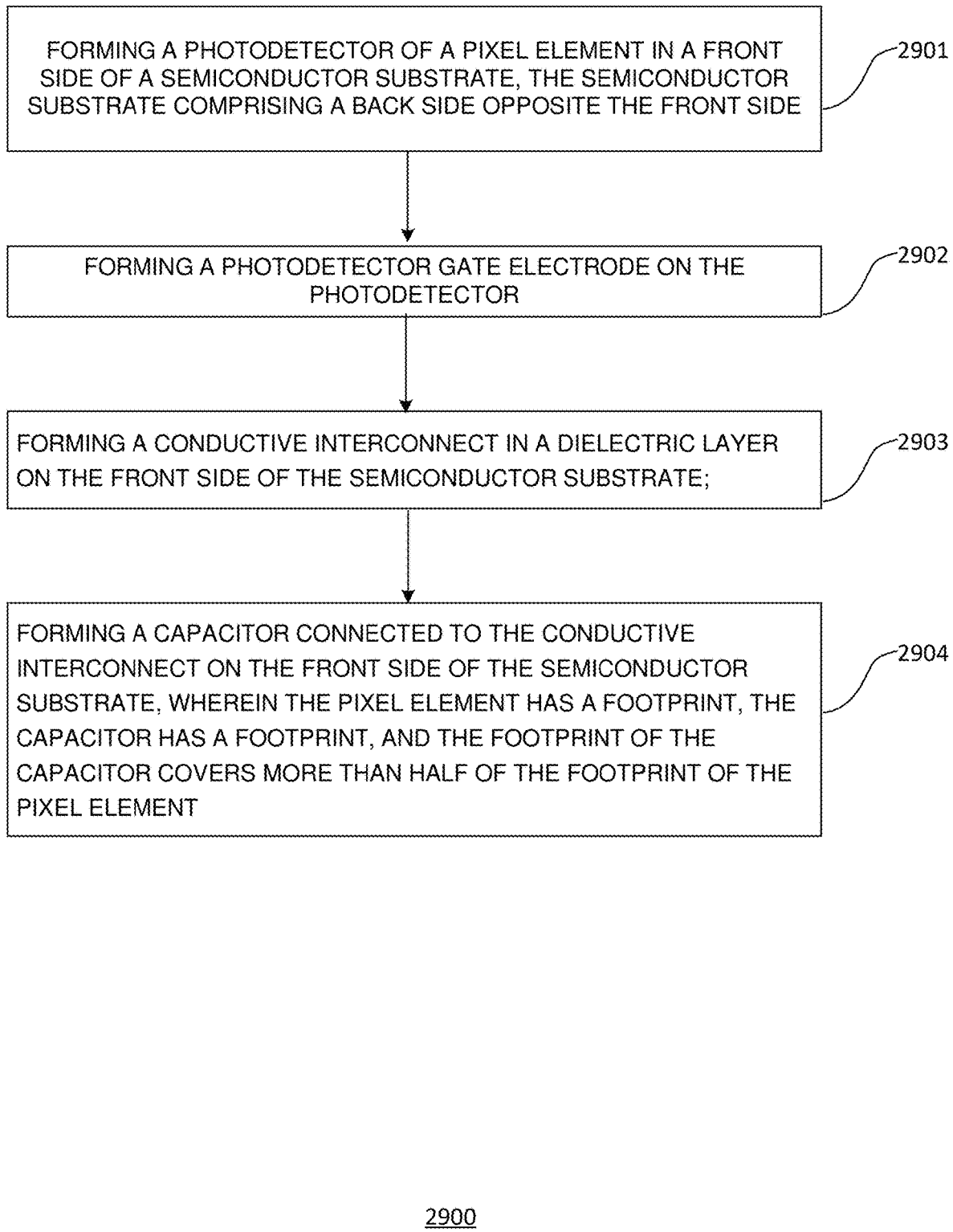
FIG. 29 is a flowchart illustrating a method 2900 of forming pixel elements 102 in accordance with some embodiments of the disclosure.

FIG. 29 is a flowchart illustrating a method 2900 of forming pixel elements 102 in accordance with some embodiments of the disclosure. Although this method and other methods illustrated and/or described herein are illustrated as a series of acts or events, it will be appreciated that the present disclosure is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included. Acts can correspond, for example, to the structure previously illustrated in FIGS. 11-28 in some embodiments.

At act 2901, a photodetector of a pixel element is formed in a front side of a semiconductor substrate, the semiconductor substrate comprising a back side opposite the front side. FIG. 13 illustrates a cross-sectional view of some embodiments corresponding to act 2901.

At act 2902, a photodetector gate electrode is formed on the photodetector. FIGS. 16-17 illustrate cross-sectional views of some embodiments corresponding to act 2902.

At act 2903, a conductive interconnect is formed in a dielectric layer on the front side of the semiconductor substrate. FIG. 18 illustrates a cross-sectional view of some embodiments corresponding to act 2903.

At act 2904, a capacitor connected to the conductive interconnect is formed on the front side of the semiconductor substrate, wherein the pixel element has a footprint, the capacitor has a footprint, and the footprint of the capacitor covers more than half of the footprint of the pixel element.

FIGS. 19-23 illustrate cross-sectional views of some embodiments corresponding to act 2904.

Note that multiple subsequent steps (e.g., forming metallization layers and other back end of line (BEOL) steps) may be performed to produce a usable working IC device.

Some embodiments relate to an integrated circuit (IC) image sensor having an array of pixel elements. Each pixel element of the array has a semiconductor substrate having a front side and an opposite back side, a photodetector disposed within the semiconductor substrate, and a portion of an interconnect structure disposed on the front side of the semiconductor substrate. The interconnect structure includes conductive interconnects embedded in one or more dielectric layers. The portion of the interconnect structure includes a capacitor. The pixel element has a footprint. The capacitor has a footprint. The footprint of the capacitor covers more than half of the footprint of the pixel element.

Some embodiments relate to an integrated circuit (IC) image sensor having an array of pixel elements. Each pixel element of the array has a semiconductor substrate having a front side and an opposite back side, a photodetector disposed within the semiconductor substrate, and a portion of an interconnect structure on the front side of the semiconductor substrate. The interconnect structure includes conductive interconnects embedded in one or more dielectric layers. The portion of the interconnect structure includes a shared capacitor. The capacitor is shared with one or more other pixel elements. The pixel element has a footprint. The capacitor has a footprint. The footprint of the capacitor covers more than half of the footprint of the corresponding pixel elements.

Some embodiments relate to a method for forming an integrated circuit (IC) image sensor. The method includes forming a photodetector of a pixel element in a front side of a semiconductor substrate, the semiconductor substrate having a back side opposite the front side, forming a photodetector gate electrode on the photodetector, forming a conductive interconnect in a dielectric layer on the front side of the semiconductor substrate, and forming a capacitor connected to the conductive interconnect on the front side of the semiconductor substrate. The pixel element has a footprint. The capacitor has a footprint. The footprint of the capacitor covers more than half of the footprint of the pixel element.

Various implementations of image sensors that include an array of pixel elements in accordance with embodiments of the application. It should be noted that alternative implementations may additionally include one or more arrays of conventional pixel elements. For example, an image sensor in accordance with embodiments of the application may comprise (1) a first array of pixel elements each including a capacitor having an area covering more than half of the area of the pixel element and (2) a second array of pixel elements each including no capacitors having an area covering more than half of the area of the pixel element (e.g., using small-area capacitors or having no capacitors at all). In other words, the term "each" refers to each pixel element of the array, not necessarily to each pixel element of the image sensor.

It will be appreciated that in this written description, as well as in the claims below, the terms "first", "second", "second", "third" etc. are merely generic identifiers used for ease of description to distinguish between different elements of a figure or a series of figures. In and of themselves, these terms do not imply any temporal ordering or structural proximity for these elements, and are not intended to be descriptive of corresponding elements in different illustrated embodiments and/or un-illustrated embodiments. For example, "a first dielectric layer" described in connection with a first figure may not necessarily correspond to a "first dielectric layer" described in connection with another figure, and may not necessarily correspond to a "first dielectric layer" in an un-illustrated embodiment.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit (IC) image sensor comprising:
an array of pixel elements, each pixel element of the array comprising:
a semiconductor substrate having a front side and an opposite back side;
a photodetector disposed within the semiconductor substrate; and
a portion of an interconnect structure disposed on the front side of the semiconductor substrate and comprising conductive interconnects embedded in one or more dielectric layers, the portion of the interconnect structure comprising a capacitor, wherein:
the pixel element has a footprint;
the capacitor has a footprint; and
the footprint of the capacitor covers more than half of the footprint of the pixel element.

2. The IC image sensor of claim 1, wherein the footprint of the capacitor covers between 70% and 90% of the footprint of the pixel element.

3. The IC image sensor of claim 1, wherein the footprint of the capacitor covers over 90% of the footprint of the pixel element.

4. The IC image sensor of claim 1, wherein:
the photodetector has a footprint; and
the footprint of the capacitor covers an entirety of the footprint of the photodetector.

5. The IC image sensor of claim 1, wherein:
the footprint of the pixel element corresponds to an orthographic projection of the pixel element onto a surface of the front side of the semiconductor substrate;
the footprint of the capacitor corresponds to an orthographic projection of the capacitor onto the surface of the front side of the semiconductor substrate; and
the footprint of the photodetector corresponds to an orthographic projection of the photodetector onto the surface of the front side of the semiconductor substrate.

6. The IC image sensor of claim 1, wherein the capacitor is a metal-insulator-metal (MIM) capacitor comprising two metal plates separated by an insulator layer.

7. The IC image sensor of claim 1, wherein:
the IC image sensor comprises a photodetector gate electrode over the photodetector;
the photodetector gate electrode has a footprint; and
the photodetector gate electrode footprint is one of a rectangle, a rounded rectangle, a triangle, and a hexagon.

8. The IC image sensor of claim 1, wherein:
the image sensor is a backlit image sensor;
each pixel element of the array further comprises:
an optical lens element on the back side of the semiconductor substrate; and
a color-filter element on the back side of the semiconductor substrate disposed between the optical lens element and the photodetector.

9. The IC image sensor of claim 1, wherein each pixel element further comprises an isolation feature in the semiconductor substrate separating the pixel element from adjoining pixel elements of the array.

10. The IC image sensor of claim 1, further comprising a second IC die bonded to the interconnect structure, the second IC die comprising semiconductor devices configured to operate with the image sensor IC.

11. An integrated circuit (IC) image sensor comprising:
an array of pixel elements, each pixel element of the array comprising:
a semiconductor substrate having a front side and an opposite back side;
a photodetector disposed within the semiconductor substrate; and
a portion of an interconnect structure disposed on the front side of the semiconductor substrate and comprising conductive interconnects embedded in one or more dielectric layers, the portion of the interconnect structure comprising a shared capacitor, wherein:
the capacitor is shared with one or more other pixel elements;
the pixel element has a footprint;
the capacitor has a footprint; and
the footprint of the capacitor covers more than half of the footprint of the corresponding pixel elements.

12. The IC image sensor of claim 11, wherein a pair of adjoining pixel elements in the array of pixel elements share the capacitor.

13. The IC image sensor of claim 12, wherein:
the pair of adjoining pixel elements also share an optical lens element; and
the pair of adjoining pixel elements form a dual photodiode (DPD) pair configured for phase detection auto-focus.

14. The IC image sensor of claim 11, wherein four pixel elements of a two-by-two set of adjoining pixel elements in the array of pixel elements share the capacitor.

15. The IC image sensor of claim 14, wherein:
the four pixel elements of the two-by-two set also share an optical lens element; and
the four pixel elements form a quad photo-diode (QPD) set configured for phase detection auto-focus.

16. A method for forming an integrated circuit (IC) image sensor, the method comprising:
forming a photodetector of a pixel element in a front side of a semiconductor substrate, the semiconductor substrate comprising a back side opposite the front side;
forming a photodetector gate electrode on the photodetector;
forming a conductive interconnect in a dielectric layer on the front side of the semiconductor substrate; and
forming a capacitor connected to the conductive interconnect on the front side of the semiconductor substrate, wherein:
the pixel element has a footprint;
the capacitor has a footprint; and
the footprint of the capacitor covers more than half of the footprint of the pixel element.

17. The method of claim 16, wherein:
the capacitor comprises an insulator interposed between a bottom electrode and a top electrode; and
forming the capacitor comprises:
depositing a first metal layer for the bottom electrode;
depositing a dielectric layer for the insulator;
depositing a second metal layer for the top electrode; and
etching the first metal layer, the dielectric layer, and the second metal layer to form the capacitor.

18. The method of claim 17, wherein the etching comprises dry etching with plasma.

19. The method of claim 16, wherein the footprint of the capacitor covers between 70% and 90% of the footprint of the pixel element.

20. The method of claim 16, further comprising forming corresponding color filter elements and optical lens elements on the back side of the semiconductor substrate to allow for backside-illuminated operation of the IC image sensor.

* * * * *